US009728693B2

(12) United States Patent
Hatano et al.

(10) Patent No.: US 9,728,693 B2
(45) Date of Patent: Aug. 8, 2017

(54) LIGHT-EMITTING DEVICE COMPRISING PARTITION INCLUDING OVERHANG PORTION

(71) Applicants: Kaoru Hatano, Atsugi (JP); Takashi Hamada, Atsugi (JP); Kikuo Miyata, Atsugi (JP); Hiromitsu Katsui, Osaka (JP); Shoji Okazaki, Osaka (JP)

(72) Inventors: Kaoru Hatano, Atsugi (JP); Takashi Hamada, Atsugi (JP); Kikuo Miyata, Atsugi (JP); Hiromitsu Katsui, Osaka (JP); Shoji Okazaki, Osaka (JP)

(73) Assignees: Semiconductor Energy Laboratory Co., Ltd., Atsugi-shi, Kanagawa-ken (JP); Sharp Kabushiki Kaisha, Osaka-shi, Osaka (JP)

(*) Notice: Subject to any disclaimer, the term of this patent is extended or adjusted under 35 U.S.C. 154(b) by 226 days.

(21) Appl. No.: 14/054,021

(22) Filed: Oct. 15, 2013

(65) Prior Publication Data

US 2014/0103385 A1    Apr. 17, 2014

(30) Foreign Application Priority Data

Oct. 17, 2012  (JP) ................................. 2012-230150

(51) Int. Cl.
| | |
|---|---|
| *H01L 27/15* | (2006.01) |
| *H01L 33/62* | (2010.01) |
| *H01L 33/00* | (2010.01) |
| *H01L 51/50* | (2006.01) |
| *H01L 51/52* | (2006.01) |
| *H01L 27/32* | (2006.01) |

(52) U.S. Cl.
CPC .......... *H01L 33/62* (2013.01); *H01L 27/3246* (2013.01); *H01L 33/005* (2013.01);
(Continued)

(58) Field of Classification Search
CPC ........................... H01L 33/62; H01L 27/3246
(Continued)

(56) References Cited

U.S. PATENT DOCUMENTS

| | | |
|---|---|---|
| 5,119,156 A | 6/1992 | Kawahara et al. |
| 6,373,453 B1 | 4/2002 | Yudasaka |

(Continued)

FOREIGN PATENT DOCUMENTS

| | | |
|---|---|---|
| CN | 101243553 A | 8/2008 |
| CN | 101271919 A | 9/2008 |

(Continued)

*Primary Examiner* — John C Ingham
*Assistant Examiner* — Ismail Muse
(74) *Attorney, Agent, or Firm* — Eric J. Robinson; Robinson Intellectual Property Law Office, P.C.

(57) ABSTRACT

Occurrence of a crosstalk phenomenon in a light-emitting device including a tandem element is suppressed. A light-emitting device includes: lower electrodes over an insulating layer; a partition over a portion between the lower electrodes, which includes an overhang portion over an end portion of each of the lower electrodes; a first light-emitting unit over each of the lower electrodes and the partition; an intermediate layer over the first light-emitting unit; a second light-emitting unit over the intermediate layer; and an upper electrode over the second light-emitting unit. The distance between the overhang portion and each of the lower electrodes is larger than the total thickness of the first light-emitting unit and the intermediate layer over the lower electrode.

15 Claims, 13 Drawing Sheets

(52) U.S. Cl.
CPC ...... *H01L 51/5044* (2013.01); *H01L 51/5278* (2013.01); *H01L 27/322* (2013.01); *H01L 27/3209* (2013.01); *H01L 2924/0002* (2013.01)

(58) Field of Classification Search
USPC .......................................................... 257/99
See application file for complete search history.

(56) References Cited

U.S. PATENT DOCUMENTS

| | | | |
|---|---|---|---|
| 6,392,722 B1 | 5/2002 | Sekime et al. | |
| 6,420,834 B2 | 7/2002 | Yamazaki et al. | |
| 6,469,439 B2 | 10/2002 | Himeshima et al. | |
| 6,555,968 B2 | 4/2003 | Yamazaki et al. | |
| 6,559,594 B2 | 5/2003 | Fukunaga et al. | |
| 6,597,121 B2 | 7/2003 | Imura | |
| 6,614,174 B1 | 9/2003 | Urabe et al. | |
| 6,618,029 B1 | 9/2003 | Ozawa | |
| 6,720,198 B2 | 4/2004 | Yamagata et al. | |
| 6,750,618 B2 | 6/2004 | Yamazaki et al. | |
| 6,768,257 B1 | 7/2004 | Yamada et al. | |
| 6,798,132 B2 | 9/2004 | Satake | |
| 6,815,723 B2 | 11/2004 | Yamazaki et al. | |
| 6,828,726 B2 | 12/2004 | Sakurai et al. | |
| 6,969,291 B2 | 11/2005 | Urabe et al. | |
| 6,991,506 B2 | 1/2006 | Yamada et al. | |
| 6,992,439 B2 | 1/2006 | Yamazaki et al. | |
| 7,015,503 B2 | 3/2006 | Seki et al. | |
| 7,057,209 B2 | 6/2006 | Yamazaki et al. | |
| 7,098,602 B2 | 8/2006 | Yamazaki et al. | |
| 7,173,281 B2 | 2/2007 | Hirakata et al. | |
| 7,214,959 B2 | 5/2007 | Seki et al. | |
| 7,221,338 B2 | 5/2007 | Yamazaki et al. | |
| 7,265,391 B2 | 9/2007 | Yamazaki et al. | |
| 7,273,801 B2 | 9/2007 | Seki et al. | |
| 7,384,860 B2 | 6/2008 | Nakamura et al. | |
| 7,402,948 B2 | 7/2008 | Yamazaki et al. | |
| 7,420,210 B2 | 9/2008 | Yamazaki et al. | |
| 7,423,293 B2 | 9/2008 | Yamagata et al. | |
| 7,442,955 B2 | 10/2008 | Seki et al. | |
| 7,531,959 B2 | 5/2009 | Hatwar et al. | |
| 7,585,761 B2 | 9/2009 | Yamazaki et al. | |
| 7,612,499 B2 | 11/2009 | Tsujimura et al. | |
| 7,623,098 B2 | 11/2009 | Yamazaki et al. | |
| 7,623,099 B2 | 11/2009 | Yamazaki et al. | |
| 7,623,100 B2 | 11/2009 | Yamazaki et al. | |
| 7,662,011 B2 | 2/2010 | Yamazaki et al. | |
| 7,683,535 B2 | 3/2010 | Fukunaga et al. | |
| 7,692,186 B2 | 4/2010 | Yamazaki et al. | |
| 7,697,106 B2 | 4/2010 | Sawasaki et al. | |
| 7,719,014 B2 | 5/2010 | Yamazaki et al. | |
| 7,745,993 B2 | 6/2010 | Fukunaga et al. | |
| 7,753,751 B2 | 7/2010 | Yamazaki | |
| 7,792,489 B2 | 9/2010 | Hirakata et al. | |
| 7,902,746 B2 | 3/2011 | Park | |
| 7,932,518 B2 | 4/2011 | Seki et al. | |
| 7,977,876 B2 | 7/2011 | Yamazaki et al. | |
| 7,982,206 B2 | 7/2011 | Yamazaki et al. | |
| 7,990,348 B2 | 8/2011 | Yamazaki et al. | |
| 8,026,531 B2 | 9/2011 | Seo et al. | |
| 8,089,066 B2 | 1/2012 | Yamazaki et al. | |
| 8,119,468 B2 | 2/2012 | Miyairi et al. | |
| 8,138,032 B2 | 3/2012 | Miyairi et al. | |
| 8,194,008 B2 | 6/2012 | Yamazaki et al. | |
| 8,237,355 B2 | 8/2012 | Yamazaki | |
| 8,432,097 B2 | 4/2013 | Hirakata et al. | |
| 8,436,528 B2 | 5/2013 | Gregory et al. | |
| 8,441,178 B2 | 5/2013 | Choi | |
| 8,441,185 B2 | 5/2013 | Kuwabara et al. | |
| 8,836,214 B2 | 9/2014 | Gregory et al. | |
| 9,337,244 B2 | 5/2016 | Hatano et al. | |
| 2001/0004469 A1 | 6/2001 | Himeshima et al. | |
| 2002/0047514 A1 | 4/2002 | Sakurai et al. | |
| 2002/0093286 A1 | 7/2002 | Ohshita et al. | |
| 2003/0146439 A1 | 8/2003 | Yamazaki et al. | |
| 2003/0189400 A1 | 10/2003 | Nishio et al. | |
| 2004/0061118 A1 | 4/2004 | Yamazaki et al. | |
| 2006/0081844 A1 | 4/2006 | Hirosue et al. | |
| 2007/0001587 A1 | 1/2007 | Hatwar et al. | |
| 2007/0015430 A1 | 1/2007 | Nishio et al. | |
| 2007/0045621 A1 | 3/2007 | Suzuki et al. | |
| 2007/0085475 A1* | 4/2007 | Kuwabara | H01L 27/3246 313/506 |
| 2007/0194321 A1 | 8/2007 | Yamazaki et al. | |
| 2007/0252524 A1* | 11/2007 | Lee | H01L 27/3209 313/509 |
| 2008/0231168 A1 | 9/2008 | Choi | |
| 2009/0009069 A1 | 1/2009 | Takata | |
| 2009/0020751 A1 | 1/2009 | Seki et al. | |
| 2009/0115318 A1 | 5/2009 | Gregory et al. | |
| 2010/0133993 A1* | 6/2010 | Pang | H01L 27/3246 313/504 |
| 2010/0171138 A1 | 7/2010 | Yamazaki et al. | |
| 2011/0266548 A1 | 11/2011 | Yamazaki et al. | |
| 2011/0273080 A1 | 11/2011 | Kimura et al. | |
| 2011/0284833 A1* | 11/2011 | Seo | C09K 11/06 257/40 |
| 2012/0007110 A1 | 1/2012 | Seo et al. | |
| 2012/0161166 A1* | 6/2012 | Yamazaki | H01L 27/3202 257/88 |
| 2012/0205698 A1* | 8/2012 | Yamazaki | H01L 51/524 257/98 |
| 2012/0205700 A1* | 8/2012 | Tanada | H01L 27/3279 257/98 |
| 2012/0217516 A1* | 8/2012 | Hatano | H01L 51/525 257/88 |
| 2012/0223342 A1* | 9/2012 | Tanada | H01L 27/3204 257/88 |
| 2012/0235558 A1* | 9/2012 | Matsuda | G03F 7/0035 313/498 |
| 2012/0273804 A1 | 11/2012 | Hatano | |
| 2012/0305922 A1 | 12/2012 | Yamazaki | |
| 2013/0001620 A1* | 1/2013 | Sugisawa | H01L 27/3276 257/98 |
| 2014/0103368 A1 | 4/2014 | Hatano et al. | |
| 2014/0175469 A1 | 6/2014 | Dozen et al. | |

FOREIGN PATENT DOCUMENTS

| | | |
|---|---|---|
| GB | 2500361 | 9/2013 |
| JP | 11-339958 A | 12/1999 |
| JP | 2001-148291 | 5/2001 |
| JP | 2001-195008 | 7/2001 |
| JP | 2003-059671 A | 2/2003 |
| JP | 2003-123969 A | 4/2003 |
| JP | 2003-243171 | 8/2003 |
| JP | 2003-243171 A | 8/2003 |
| JP | 2003-257650 | 9/2003 |
| JP | 2005-235491 | 9/2005 |
| JP | 2005-235491 A | 9/2005 |
| JP | 2005-251497 A | 9/2005 |
| JP | 2006-010986 A | 1/2006 |
| JP | 2006-302870 | 11/2006 |
| JP | 2007-141821 A | 6/2007 |
| JP | 2008-234885 | 10/2008 |
| JP | 2008-235248 A | 10/2008 |
| JP | 2009-500790 | 1/2009 |
| JP | 2010-027591 | 2/2010 |
| JP | 2012-043813 A | 3/2012 |
| JP | 2012-190794 A | 10/2012 |
| KR | 2008-0040772 A | 5/2008 |
| KR | 2008-0086201 A | 9/2008 |
| TW | I307978 | 3/2009 |
| TW | I404247 | 8/2013 |
| WO | WO-2007/005200 | 1/2007 |
| WO | WO-2007/023272 | 3/2007 |
| WO | WO-2012/115016 | 8/2012 |

* cited by examiner

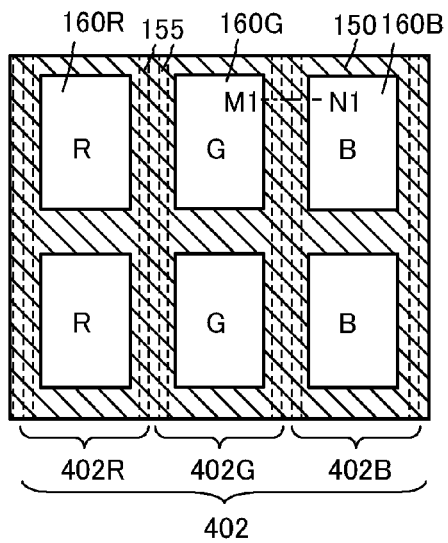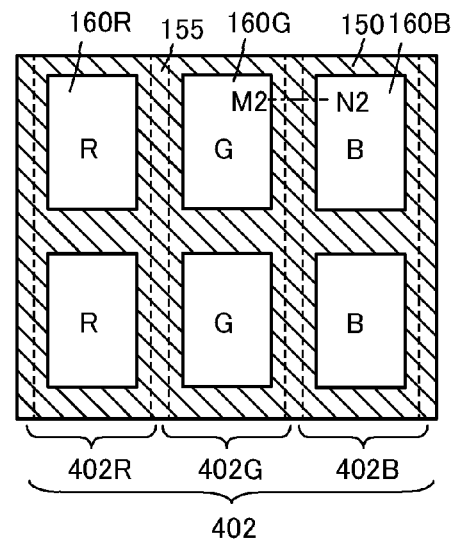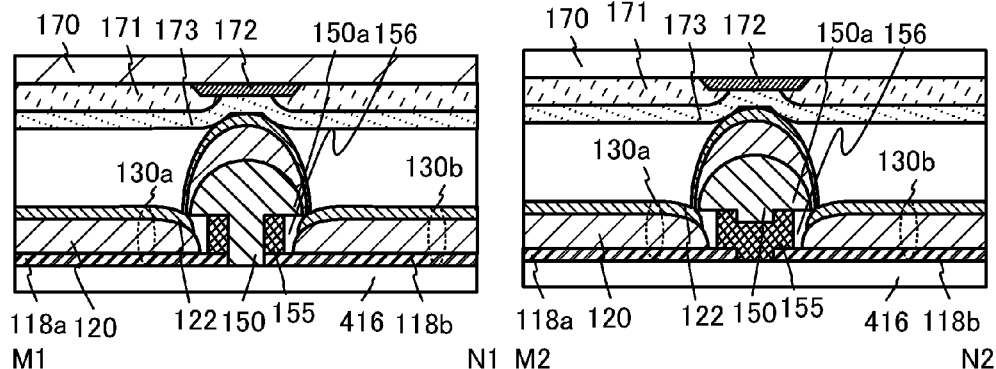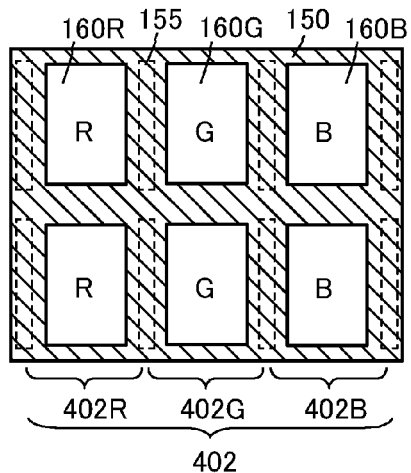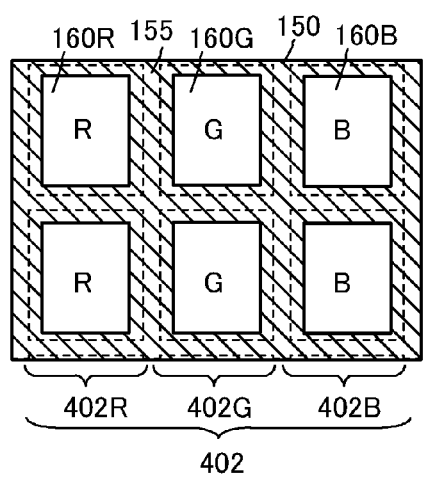

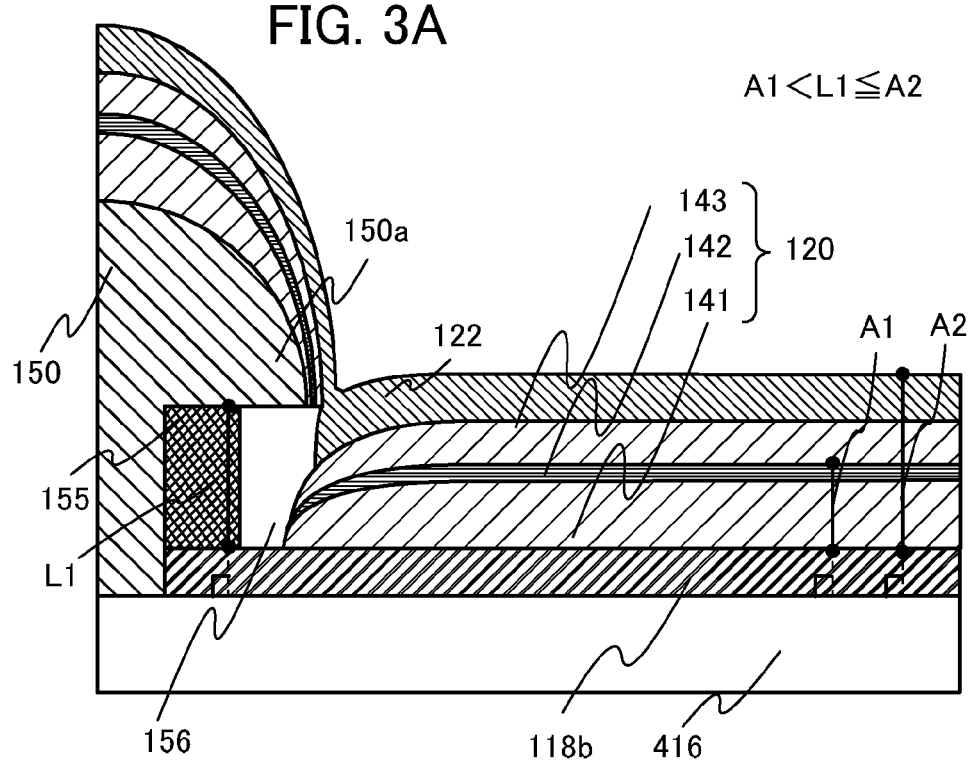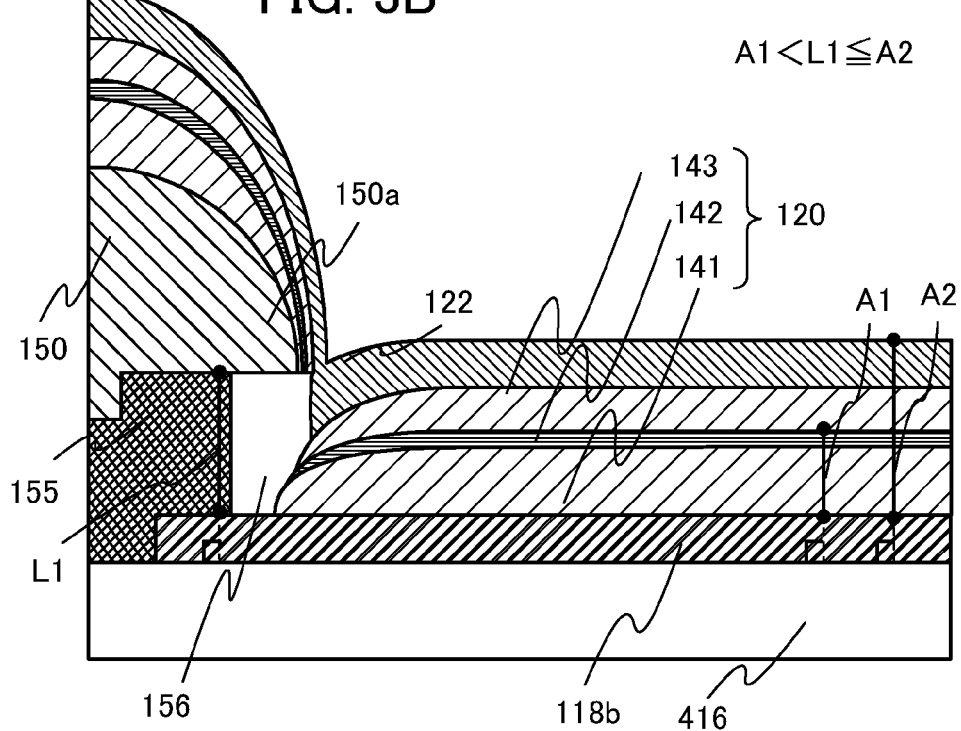

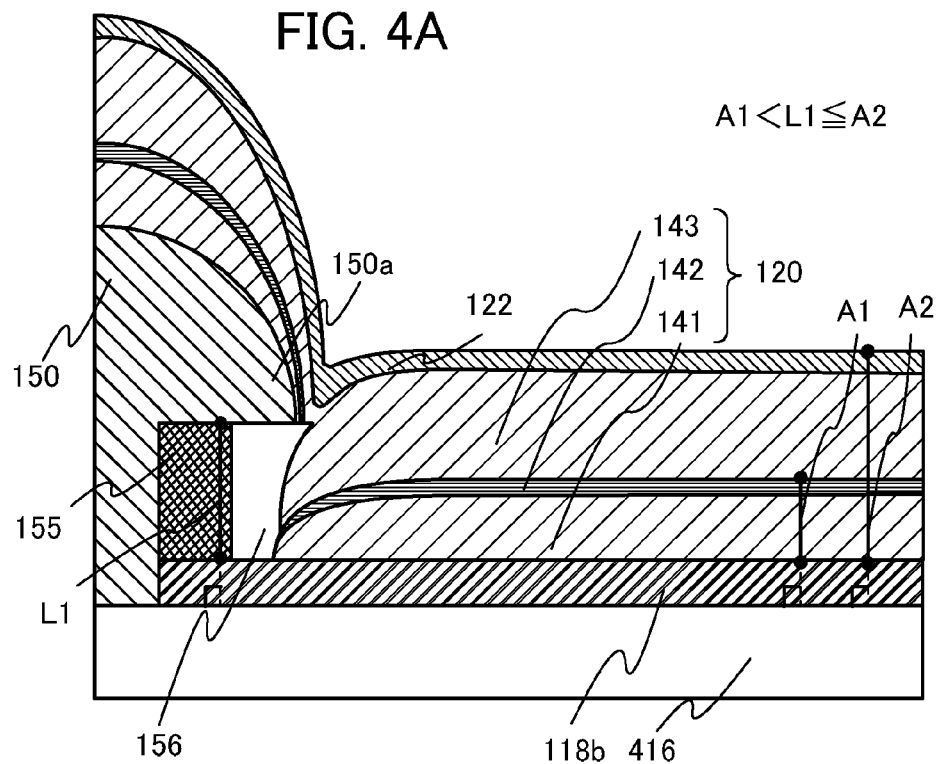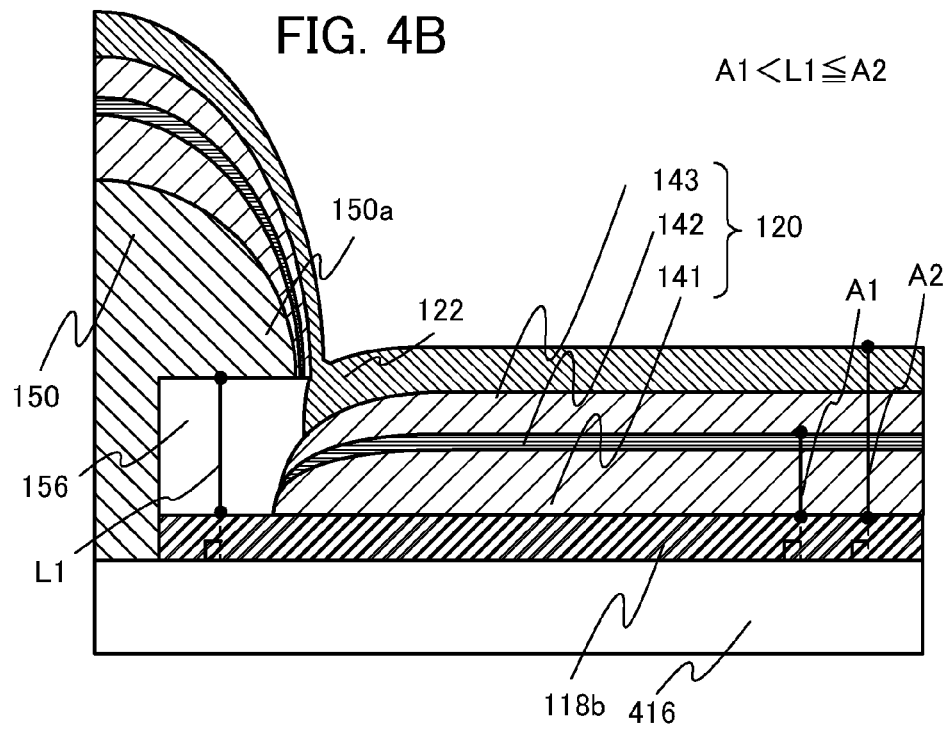

FIG. 8A
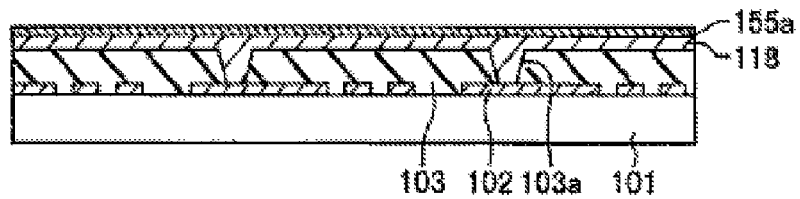
FIG. 8B1
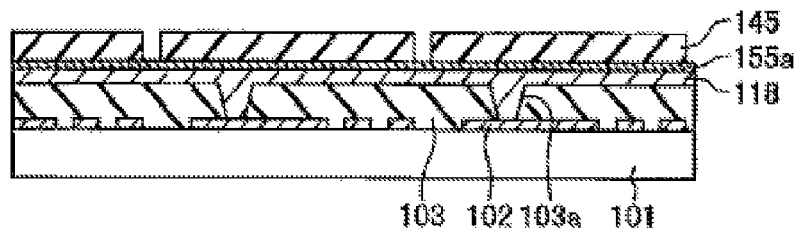
FIG. 8B2
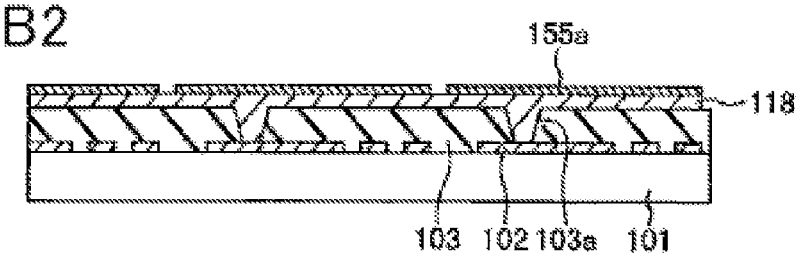
FIG. 8C
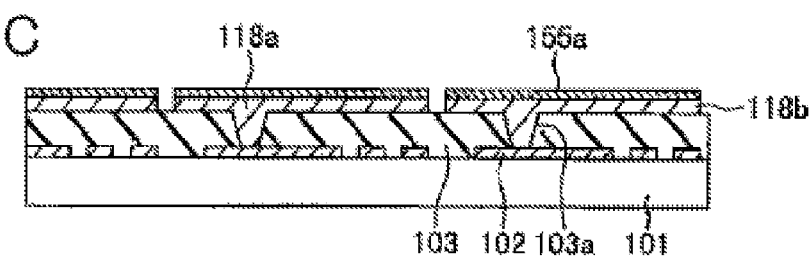
FIG. 8D
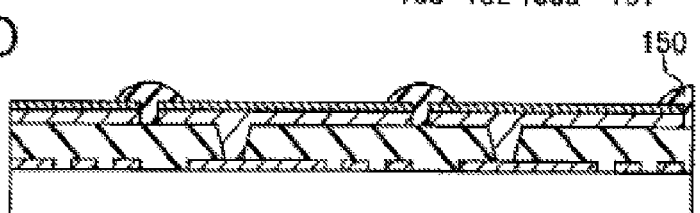
FIG. 8E
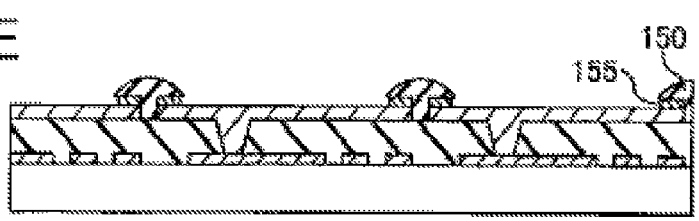

LIGHT-EMITTING DEVICE COMPRISING PARTITION INCLUDING OVERHANG PORTION

BACKGROUND OF THE INVENTION

1. Field of the Invention

One embodiment of the present invention relates to a light-emitting device including a tandem element and a method for manufacturing the light-emitting device.

2. Description of the Related Art

Commercialization of organic EL displays is accelerating. Displays are increasingly required to provide high luminance for outdoor use. It is known that the luminance of an organic EL element increases in proportion to electric current and light emission at high luminance can be achieved.

However, a large current flow accelerates deterioration of organic EL elements. Thus, if high luminance can be achieved with a small amount of current, light-emitting elements can have longer lifetime. In this regard, a tandem element in which a plurality of light-emitting units is stacked has been proposed as a light-emitting element capable of providing high luminance with a small amount of current (see Patent Document 1, for example).

Note that in this specification, a light-emitting unit refers to a layer or a stacked body which includes one region where electrons and holes injected from both ends are recombined.

A tandem element in which n light-emitting units of one embodiment are stacked between electrodes can provide light emission comparable to that of one light-emitting element (single element) by making current with a density of 1/n of that of the light-emitting element (single element) flow through each light-emitting unit. The tandem element can achieve n times as high luminance as the single element at the same current density.

One problem of a light-emitting panel in which tandem elements are provided adjacently is occurrence of a crosstalk phenomenon. The crosstalk phenomenon refers to a phenomenon in which, in the case where a highly conductive layer is provided in adjacent tandem elements, current leaks from one tandem element into another adjacent tandem element through the highly conductive layer.

A tandem element includes a stack of a plurality of layers with a highly conductive intermediate layer therebetween, and includes a layer with high conductivity and a layer with low conductivity because of its structure. In addition, in the tandem element, a highly conductive carrier-injection layer containing a mixed material of an organic compound and a metal oxide, a conductive high molecular compound, or the like is often used in order to decrease driving voltage. Furthermore, in the tandem element, electrical resistance between an anode and a cathode is higher than in a single element; thus, current is easily transmitted to an adjacent pixel through the highly conductive layer.

FIG. 12 is a schematic diagram illustrating occurrence of a crosstalk phenomenon due to a highly conductive intermediate layer 86. FIG. 12 shows a cross section of a light-emitting panel (white panel) including three tandem elements arranged in the form of stripes and configured to emit white light, in which only a second tandem element (B line, blue line) is driven.

The light-emitting panel includes first to third tandem elements which are adjacent to one another. The first tandem element (R line, red line) is provided between an upper electrode 81 and a first lower electrode 82. The second tandem element is provided between the upper electrode 81 and a second lower electrode 83. The third tandem element (G line, green line) is provided between the upper electrode 81 and a third lower electrode 84.

In each of the first to third tandem elements, a first light-emitting unit 85, the intermediate layer 86, and a second light-emitting unit 87 are sequentially stacked. For example, when the first light-emitting unit 85 includes a light-emitting layer capable of emitting blue light and the second light-emitting unit 87 includes a light-emitting layer capable of emitting green light and a light-emitting layer capable of emitting red light, each tandem element can provide white light emission.

In FIG. 12, a light-transmitting electrode is used as the upper electrode, and a counter glass substrate 88 is provided over the upper electrode. The counter glass substrate 88 is provided with a blue color filter, a red color filter, and a green color filter which are not illustrated. The red color filter, the blue color filter, and the green color filter overlap with the first lower electrode 82, the second lower electrode 83, and the third lower electrode 84, respectively.

When only the blue line is driven in the above-described light-emitting panel by application of a voltage between the second lower electrode 83 and the upper electrode 81, current might leak into the adjacent first or third tandem element through the highly conductive intermediate layer 86, causing the red or green line to emit light and a crosstalk phenomenon to occur.

FIG. 13 is a schematic diagram illustrating occurrence of a crosstalk phenomenon due to a highly conductive carrier-injection layer (hole-injection layer or electron-injection layer) 89, and shows a cross section of a light-emitting panel (white panel) in which only a blue line is driven.

In each of first to third tandem elements, a first light-emitting unit 85 including the highly conductive carrier-injection layer 89, an intermediate layer 86, and a second light-emitting unit 87 are sequentially stacked. As an example of the carrier-injection layer 89, a highly conductive layer containing a mixed material of an organic compound and a metal oxide, a conductive high molecular compound, or the like can be given.

REFERENCE

[Patent Document 1] Japanese Published Patent Application No. 2008-234885

SUMMARY OF THE INVENTION

An object of one embodiment of the present invention is to suppress occurrence of a crosstalk phenomenon in a light-emitting device including a tandem element. Another object of one embodiment of the present invention is to manufacture a light-emitting device capable of suppressing occurrence of a crosstalk phenomenon even when including a tandem element, by a method with a wide process margin (allowable range of process conditions).

One embodiment of the present invention is a light-emitting device including: a first electrode and a second electrode over an insulating layer; a partition over a portion between the first electrode and the second electrode, the partition including an overhang portion over an end portion of each of the first electrode and the second electrode; a first light-emitting unit over each of the first electrode, the partition, and the second electrode; an intermediate layer over the first light-emitting unit; a second light-emitting unit over the intermediate layer; and a third electrode over the second light-emitting unit. The distance between the overhang portion and each of the first electrode and the second electrode is larger than the total thickness of the first light-emitting unit and the intermediate layer over the first electrode.

In the above embodiment of the present invention, since the distance between the overhang portion of the partition and each of the first electrode and the second electrode is larger than the total thickness of the first light-emitting unit and the intermediate layer over the first electrode, the intermediate layer can be disconnected at the overhang portion. Accordingly, occurrence of a crosstalk phenomenon can be suppressed.

In one embodiment of the present invention, the distance between the overhang portion and each of the first electrode and the second electrode may be smaller than or equal to the total thickness of the first light-emitting unit, the intermediate layer, the second light-emitting unit, and the third electrode over the first electrode.

One embodiment of the present invention is a light-emitting device including: a first electrode and a second electrode over an insulating layer; a partition over a portion between the first electrode and the second electrode, the partition including an overhang portion over an end portion of each of the first electrode and the second electrode; a first light-emitting unit over each of the first electrode, the partition, and the second electrode; an intermediate layer over the first light-emitting unit; a second light-emitting unit over the intermediate layer; and a third electrode over the second light-emitting unit. At the overhang portion, the first light-emitting unit and the intermediate layer are disconnected.

In one embodiment of the present invention, a spacer may be formed between the overhang portion and the end portion of each of the first electrode and the second electrode.

In one embodiment of the present invention, the partition may be formed between the first electrode and the second electrode so as to be in contact with the end portion of each of the first electrode and the second electrode, and the first electrode and the second electrode may be electrically isolated from each other by the partition.

In one embodiment of the present invention, the spacer may be formed between the first electrode and the second electrode so as to be in contact with the end portion of each of the first electrode and the second electrode, and the first electrode and the second electrode may be electrically isolated from each other by the spacer.

In one embodiment of the present invention, a space may be formed between the overhang portion and each of the first electrode and the second electrode.

In one embodiment of the present invention, the first light-emitting unit may include a carrier-injection layer so that driving voltage can be decreased. In the light-emitting device of one embodiment of the present invention, the carrier-injection layer can be disconnected at the overhang portion. Accordingly, even when the carrier-injection layer is provided in order to decrease driving voltage, occurrence of a crosstalk phenomenon can be suppressed.

In one embodiment of the present invention, a color filter may be provided over the first electrode and the second electrode, and the color filter may have a first color and a second color so as to overlap with the first electrode and the second electrode, respectively.

One embodiment of the present invention is a method for manufacturing a light-emitting device, which includes the steps of: forming a first electrode and a second electrode over an insulating layer; forming a sacrifice layer over the insulating layer, the first electrode, and the second electrode; processing the sacrifice layer, thereby removing the sacrifice layer from a portion between the first electrode and the second electrode and leaving the sacrifice layer over each of the first electrode and the second electrode; forming a partition over the insulating layer between the first electrode and the second electrode and over the sacrifice layer; removing the sacrifice layer by etching; forming a first light-emitting unit over the first electrode, the partition, and the second electrode; forming an intermediate layer over the first light-emitting unit; forming a second light-emitting unit over the intermediate layer; and forming a third electrode over the second light-emitting unit. The thickness of the sacrifice layer over each of the first electrode and the second electrode is larger than a height from a surface of each of the first electrode and the second electrode to a surface of the intermediate layer.

One embodiment of the present invention is a method for manufacturing a light-emitting device, which includes the steps of: forming an electrode layer over an insulating layer; forming a sacrifice layer over the electrode layer; processing the sacrifice layer and the electrode layer, thereby forming a first electrode and a second electrode from the electrode layer over the insulating layer and leaving the sacrifice layer over each of the first electrode and the second electrode; forming a partition over the insulating layer between the first electrode and the second electrode and over the sacrifice layer; removing the sacrifice layer by etching; forming a first light-emitting unit over the first electrode, the partition, and the second electrode; forming an intermediate layer over the first light-emitting unit; forming a second light-emitting unit over the intermediate layer; and forming a third electrode over the second light-emitting unit. The thickness of the sacrifice layer over each of the first electrode and the second electrode is larger than a height from a surface of each of the first electrode and the second electrode to a surface of the intermediate layer.

In one embodiment of the present invention, the thickness of the sacrifice layer over each of the first electrode and the second electrode may be smaller than or equal to a height from the surface of each of the first electrode and the second electrode to a surface of the third electrode.

In one embodiment of the present invention, in the step of removing the sacrifice layer by etching, a spacer may be formed from the sacrifice layer between the partition and each of the first electrode and the second electrode by removing the sacrifice layer by etching using the partition as a mask.

One embodiment of the present invention is a method for manufacturing a light-emitting device, which includes the steps of: forming a first electrode and a second electrode over an insulating layer; forming a sacrifice layer having an insulating property over the insulating layer, the first electrode, and the second electrode; processing the sacrifice layer, thereby removing the sacrifice layer from a portion over a middle portion of an upper surface of each of the first electrode and the second electrode, leaving the sacrifice layer between the first electrode and the second electrode, and leaving the sacrifice layer over an end portion of each of the first electrode and the second electrode; forming a partition over the sacrifice layer between the first electrode and the second electrode; removing the sacrifice layer by etching using the partition as a mask, thereby forming a spacer from the sacrifice layer between the partition and each of the first electrode and the second electrode; forming a first light-emitting unit over the first electrode, the partition, and the second electrode; forming an intermediate layer over the first light-emitting unit; forming a second light-emitting unit over the intermediate layer; and forming a third electrode over the second light-emitting unit. The thickness of the spacer is larger than a height from a surface of each of the first electrode and the second electrode to a surface of the intermediate layer.

One embodiment of the present invention is a method for manufacturing a light-emitting device, which includes the steps of: forming a first electrode and a second electrode over an insulating layer; forming a sacrifice layer having an insulating property over the insulating layer, the first electrode, and the second electrode; forming a partition over the sacrifice layer between the first electrode and the second electrode; removing the sacrifice layer by etching using the partition as a mask, thereby forming a spacer from the sacrifice layer between the partition and each of the first electrode and the second electrode; forming a first light-emitting unit over the first electrode, the partition, and the second electrode; forming an intermediate layer over the first light-emitting unit; forming a second light-emitting unit over the intermediate layer; and forming a third electrode over the second light-emitting unit. The thickness of the spacer is larger than a height from a surface of each of the first electrode and the second electrode to a surface of the intermediate layer.

In one embodiment of the present invention, the thickness of the spacer may be smaller than or equal to a height from the surface of each of the first electrode and the second electrode to a surface of the third electrode.

Note that a light-emitting device in this specification includes a display device having a light-emitting element in a pixel (or a sub-pixel). A light-emitting panel includes a display panel in which pixels each having a light-emitting element are provided adjacently. Note that a light-emitting module includes a light-emitting element, and the light-emitting element has a light-emitting unit including a light-emitting layer.

In accordance with one embodiment of the present invention, occurrence of a crosstalk phenomenon can be suppressed. In addition, in accordance with one embodiment of the present invention, a light-emitting device capable of suppressing occurrence of a crosstalk phenomenon even when including a tandem element can be manufactured by a method with a wide process margin.

BRIEF DESCRIPTION OF THE DRAWINGS

FIGS. 2A1 and 2A2 are top views of pixels, FIG. 2B is a cross-sectional view along dashed line M1-N1 in FIG. 2A1, FIG. 2C is a cross-sectional view along dashed line M2-N2 in FIG. 2A2, FIG. 2D is a top view of pixels in a modified example of FIG. 2A2, and FIG. 2E is a top view of pixels in a modified example of FIG. 2A2.

FIG. 3A is an enlarged cross-sectional view of a partition, a spacer, and a light-emitting element illustrated in FIG. 2B, and FIG. 3B is an enlarged cross-sectional view of a partition, a spacer, and a light-emitting element illustrated in FIG. 2C.

FIGS. 4A and 4B are cross-sectional views each illustrating a modified example of FIG. 3A.

FIGS. 8A, 8B1, 8B2, and 8C to 8E are cross-sectional views illustrating a method for manufacturing a partition according to one embodiment of the present invention.

DETAILED DESCRIPTION OF THE INVENTION

Embodiments of the present invention will be described in detail below with reference to drawings. Note that the present invention is not limited to the following description, and it is easily understood by those skilled in the art that various changes and modifications can be made without departing from the spirit and scope of the present invention. Therefore, the present invention should not be construed as being limited to the description in the following embodiments.

Embodiment 1

<Structure of Display Panel>

Figure 1A:
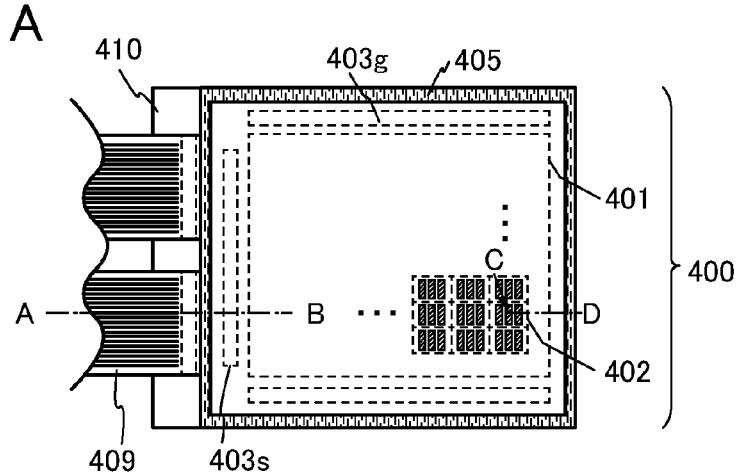
FIG. 1A is a top view of a structure of a display panel which can be used for a display device in one embodiment of the present invention.
Figure 1B:
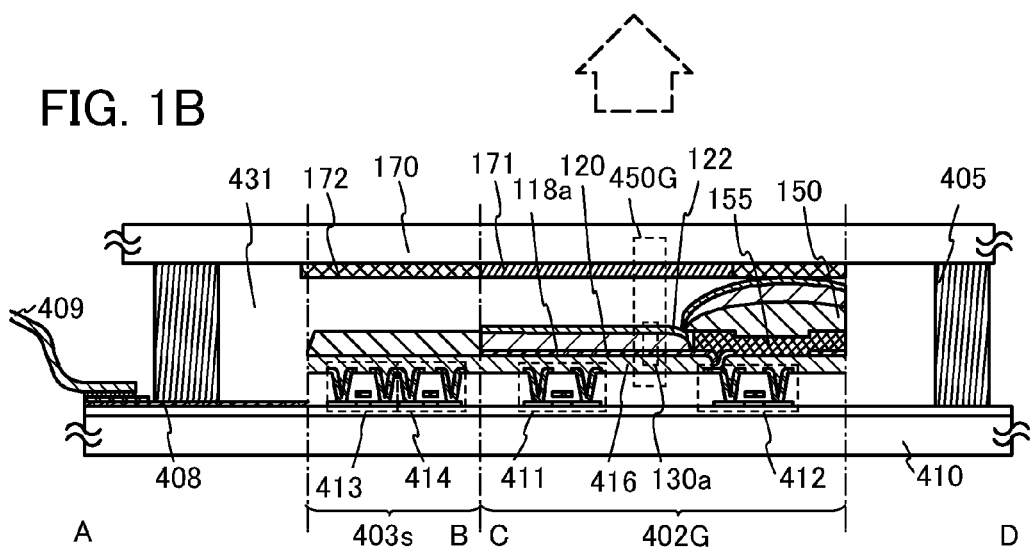
FIG. 1B is a side view of the structure including cross sections along section lines A-B and C-D in FIG. 1A.

FIGS. 1A and 1B illustrate a structure of a display panel which can be used for a display device in one embodiment of the present invention. FIG. 1A is a top view of the structure of the display panel which can be used for a display device in one embodiment of the present invention, and FIG. 1B is a side view of the structure including cross sections along section lines A-B and C-D in FIG. 1A.

A display panel 400 shown as an example in this embodiment includes a display portion 401 over a first substrate 410. The display portion 401 includes a plurality of pixels 402. The pixel 402 includes a plurality of sub-pixels (e.g., three sub-pixels) (see FIG. 1A). Over the first substrate 410, in addition to the display portion 401, a source side driver circuit portion 403s and a gate side driver circuit portion 403g which drive the display portion 401 are provided. Note that the driver circuit portions can be provided not over the first substrate 410 but externally.

The display panel 400 includes an external input terminal and receives a video signal, a clock signal, a start signal, a reset signal, and the like from a flexible printed circuit (FPC) 409.

A sealant 405 bonds the first substrate 410 and a second substrate (hereinafter also referred to as "counter substrate") 170. The display portion 401 is sealed in a space 431 formed between the substrates (see FIG. 1B).

The structure including the cross sections of the display panel 400 is described with reference to FIG. 1B. The display panel 400 includes the source side driver circuit portion 403s, a sub-pixel 402G included in the pixel 402, and a lead wiring 408. Note that the display portion 401 of the display panel 400 shown as an example in this embodiment emits light in the direction denoted by the arrow in the drawing, thereby displaying images.

The source side driver circuit portion 403s includes a CMOS circuit which is a combination of an n-channel transistor 413 and a p-channel transistor 414. Note that the driver circuit is not limited to this structure and may be various circuits, such as a CMOS circuit, a PMOS circuit, or an NMOS circuit.

The lead wiring 408 transmits a signal inputted from the external input terminal to the source side driver circuit portion 403s and the gate side driver circuit portion 403g.

The sub-pixel 402G includes a switching transistor 411, a current control transistor 412, and a light-emitting module 450G. Note that an insulating layer 416 and a partition 150 are formed over the transistor 411 and the like. The light-emitting module 450G includes a light-emitting element 130a having a first electrode 118a (hereinafter also referred to as "lower electrode 118a"), a third electrode 122 (hereinafter also referred to as "upper electrode 122"), and an organic layer 120 between the lower electrode 118a and the upper electrode 122, and a color filter 171 provided on the upper electrode 122 side through which light emitted from the light-emitting element 130a is extracted. Note that a direction of an image displayed in the display portion 401 is determined in accordance with a direction in which light emitted from the light-emitting element 130a is extracted.

Note that it is acceptable as long as at least one of the lower electrode 118a and the upper electrode 122 in the light-emitting element 130a transmits light emitted from the organic layer 120. For example, FIG. 1B illustrates the structure in which the upper electrode 122 transmits light emitted from the organic layer 120.

In addition, a light-blocking film (hereinafter also referred to as "black matrix") 172 is formed so as to surround the color filter 171. The black matrix 172 prevents a phenomenon in which the display panel 400 reflects outside light, and has an effect of increasing the contrast of images displayed in the display portion 401. Note that the color filter 171 and the black matrix 172 are formed over the counter substrate 170.

The insulating layer 416 is a layer having insulating properties for planarizing a step due to the structure of the transistor 411 and the like or for suppressing impurity diffusion into the transistor 411 and the like. The insulating layer 416 can be a single layer or a stacked layer. The partition 150 is an insulating layer having an opening; the light-emitting element 130a is formed in the opening of the partition 150.

<Structure of Transistor>

Top-gate transistors are used in the display panel 400 shown as an example in FIG. 1A. However, the present invention is not limited to this example, and bottom-gate transistors may be used. Various types of transistors can be used for the source side driver circuit portion 403s, the gate side driver circuit portion 403g, and the sup-pixels. Note that various semiconductors can be used for regions where channels of these transistors are formed. Specifically, as well as amorphous silicon, polysilicon, or single crystal silicon, an oxide semiconductor or the like can be used. As an example of an oxide semiconductor, an oxide semiconductor containing at least indium (In) or zinc (Zn) can be given, and an oxide semiconductor containing In and Zn is preferable. An oxide semiconductor containing gallium (Ga) or tin (Sn) or both is particularly preferable.

When a single crystal semiconductor is used for a region where a channel of a transistor is formed, the size of the transistor can be reduced, which results in even higher resolution pixels in a display portion.

As a single crystal semiconductor used for forming a semiconductor layer, a semiconductor substrate, such as a single crystal silicon substrate, or a silicon on insulator (SOI) substrate in which a single crystal semiconductor layer is provided on an insulating surface can be used.

<Configuration of Pixel>

A configuration of the pixel 402 included in the display portion 401 is described with reference to FIGS. 2A1 and 2B and FIG. 3A.

FIGS. 2A1, 2A2, and 2B to 2E illustrate examples of positional relationship between the partition 150, a spacer 155, and light-emitting portions 160R, 160G, and 160B. FIG. 2A1 is a top view of the pixels 402, and FIG. 2B is an example of a cross-sectional view along dashed line M1-N1 in FIG. 2A1. FIG. 3A is an example of an enlarged cross-sectional view of the partition, the spacer, and a light-emitting element 130b illustrated in FIG. 2B. Note that the illustration of the organic layer 120, the upper electrode 122, an overcoat layer 173, the color filter 171, the black matrix 172, and the counter substrate 170 is omitted in FIG. 2A1.

The pixel 402 shown as an example in this embodiment includes a sub-pixel 402R emitting red light R, a sub-pixel 402G emitting green light G, and a sub-pixel 402B emitting blue light B. The sub-pixel 402R includes a red light-emitting portion 160R, the sub-pixel 402G includes a green light-emitting portion 160G, and the sub-pixel 402B includes a blue light-emitting portion 160B. The red light-emitting portion 160R, the green light-emitting portion 160G, and the blue light-emitting portion 160B are provided in respective openings in the partition 150 (see FIG. 2A1).

Each of the light-emitting portions 160R, 160G, and 160B includes a light-emitting element including a lower electrode, an organic layer, and an upper electrode. For example, the green light-emitting portion 160G includes the light-emitting element 130a including the lower electrode 118a, the organic layer 120, and the upper electrode 122, and the blue light-emitting portion 160B includes the light-emitting element 130b including a second electrode 118b (hereinafter also referred to as "lower electrode 118b"), the organic layer 120, and the upper electrode 122 (see FIG. 2B). The organic layer 120 includes a first light-emitting unit 141, an intermediate layer 142, and a second light-emitting unit 143 (see FIG. 3A). The counter substrate 170 is provided with the color filter 171 overlapping with the light-emitting portion, the black matrix 172 overlapping with the partition, and the overcoat layer 173 covering the color filter 171 and the black matrix 172 (see FIG. 2B). The overcoat layer 173 is not necessarily provided when not needed.

Each of the light-emitting portions 160R, 160G, and 160B includes the light-emitting element including the lower electrode, the upper electrode 122, and the organic layer 120 including the first light-emitting unit 141, the intermediate layer 142, and the second light-emitting unit 143. The conductivity of the intermediate layer 142 is higher than that of the first light-emitting unit 141.

The sub-pixel 402G includes a driver transistor and the light-emitting module 450G. The other sub-pixels 402R and 402B also have a structure similar to that of the sub-pixel 402G. Each light-emitting module includes the light-emitting element including the lower electrode, the upper electrode 122, and the organic layer 120 between the lower electrode and the upper electrode 122 (see FIG. 1B).

The light-emitting element has a structure in which the organic layer 120 including the first light-emitting unit 141, the intermediate layer 142, and the second light-emitting unit 143 is provided between the lower electrode and the upper electrode 122.

Note that it is acceptable as long as at least one of the lower electrode and the upper electrode 122 in the light-emitting element transmits light emitted from the organic layer 120. For example, a reflective film may be used for the lower electrodes 118a and 118b, and a semi-transmissive and semi-reflective film may be used for the upper electrode 122. When a microresonator is formed by making an overlap between the reflective film and the semi-transmissive and semi-reflective film and the organic layer 120 is formed therebetween, light with a specific wavelength can be efficiently extracted from the semi-transmissive and semi-reflective film (upper electrode 122) side. The wavelength of extracted light depends on the distance between the reflective film and the semi-transmissive and semi-reflective film, and the distance can be adjusted by forming an optical adjustment layer between the reflective film and the semi-transmissive and semi-reflective film.

A conductive film having light-transmitting properties with respect to visible light or a layer containing a light-emitting organic compound can be employed for a material that can be used for the optical adjustment layer. For example, the thickness of a charge-generation region may be adjusted so that the charge-generation region also serves as the optical adjustment layer. Alternatively, the thickness of a region (mixed material layer) containing a substance having a high hole-transport property and a substance exhibiting an acceptor property with respect to the substance having a high hole-transport property may be adjusted so that the mixed material layer also serves as the optical adjustment layer. This is preferably used because an increase in driving voltage can be suppressed even when the optical adjustment layer is thick.

Note that the structural example of the light-emitting element will be described in detail in Embodiment 2.

The light-emitting module 450G shown as an example in this embodiment has a structure in which the upper electrode 122 of the light-emitting element provided in the light-emitting module also serves as a semi-transmissive and semi-reflective film. In more detail, the upper electrode 122 shared by the light-emitting elements also serves as a semi-transmissive and semi-reflective film of each light-emitting module.

In addition, the lower electrode of the light-emitting element is provided in an electrically separate manner in each light-emitting module, and the lower electrode also serves as a reflective film of the light-emitting module.

The lower electrode also serving as a reflective film of each light-emitting module has a stacked-layer structure in which an optical adjustment layer is stacked over the reflective film. The optical adjustment layer is preferably formed of a conductive film having light-transmitting properties with respect to visible light, and the reflective film is preferably formed of a conductive metal film having high reflectivity with respect to visible light.

The thickness of the optical adjustment layer is adjusted in accordance with a wavelength of light extracted from a light-emitting module. Specific description is given below.

For example, the light-emitting module (blue) includes a color filter which transmits blue light, the lower electrode also serving as a reflective film, and the upper electrode also serving as a semi-transmissive and semi-reflective film; the optical path length between the lower electrode and the upper electrode is adjusted to intensify light having a wavelength greater than or equal to 400 nm and less than 500 nm.

Further, the light-emitting module 450G includes a color filter which transmits green light, a reflective film, and a semi-transmissive and semi-reflective film; the optical path length between the reflective film and the semi-transmissive and semi-reflective film is adjusted to intensify light having a wavelength greater than or equal to 500 nm and less than 600 nm.

Further, the light-emitting module (red) includes a color filter which transmits red light, a reflective film, and a semi-transmissive and semi-reflective film; the optical path length between the reflective film and the semi-transmissive and semi-reflective film is adjusted to intensify light having a wavelength greater than or equal to 600 nm and less than 800 nm.

In such a light-emitting module, interference of light emitted from the light-emitting elements occurs between the reflective film and the semi-transmissive and semi-reflective film, light having a specific wavelength in the range of greater than or equal to 400 nm and less than 800 nm is intensified, and unnecessary light is absorbed by the color filter.

Note that each light-emitting module includes the organic layer 120 including the first light-emitting unit 141, the intermediate layer 142, and the second light-emitting unit 143. In addition, one of the pair of electrodes (lower and upper electrodes) of each light-emitting element also serves as a reflective film and the other thereof also serves as a semi-transmissive and semi-reflective film.

In the light-emitting modules with such a structure, light-emitting units can be formed in the same process.

<Structure of Partition>

The partition 150 is formed at the periphery of the pixels 402, at the periphery of the sub-pixels 402B, 402G, and 402R, and at the periphery of the light-emitting portions 160R, 160G, and 160B (see FIG. 2A1).

The partition 150 is formed between the lower electrodes 118a and 118b and over end portions of the lower electrodes 118a and 118b. The partition 150 has an overhang portion 150a over the end portion of each of the lower electrodes 118a and 118b, and the spacer 155 is formed between the end portion of each of the lower electrodes 118a and 118b and the overhang portion 150a of the partition 150. The spacer 155 serves to place the overhang portion 150a of the partition 150 above upper surfaces of the lower electrodes 118a and 118b. The overhang portion 150a of the partition 150 is preferably shaped so as to extend beyond the spacer 155, and a space 156 is preferably formed between the overhang portion 150a and each of the lower electrodes 118a and 118b. As a material of the partition 150, a negative or positive photosensitive resin can be used (see FIG. 2B). The spacer 155 may be formed using a conductive material or an insulating material.

As illustrated in FIG. 3A, the height L1 of the spacer 155 (i.e., the distance between the lower electrode 118b and the overhang portion 150a of the partition 150) is larger than the total thickness A1 of the first light-emitting unit 141 and the intermediate layer 142 and is smaller than or equal to the total thickness A2 of the organic layer 120 and the upper electrode 122. Accordingly, the first light-emitting unit 141 and the intermediate layer 142 having high conductivity can be disconnected at the overhang portion 150a of the partition, and the upper electrode 122 can be prevented from being disconnected. Note that the height L1 of the spacer 155 and the thicknesses A1 and A2 each correspond to the length of a perpendicular line drawn from a surface of each layer to a surface on which the lower electrode is formed or a surface of a substrate.

When the upper electrode 122 has a region with a small thickness due to the presence of the spacer 155, defective light emission due to a potential decrease resulting from the resistance of the upper electrode 122 might cause a defect such as display luminance unevenness. Therefore, it is preferable that the second light-emitting unit 143 be not disconnected as illustrated in FIG. 4A so that the upper electrode 122 is not disconnected and a decrease in thickness of the upper electrode 122 is suppressed.

Although the spacer 155 is provided between the lower electrode 118b and the overhang portion 150a of the partition 150 in FIG. 3A or FIG. 4A, the spacer 155 may be eliminated and the space 156 may be formed between the lower electrode 118b and the overhang portion 150a of the partition 150 as illustrated in FIG. 4B.

One example of an organic EL element according to one embodiment of the present invention is given below.

Thickness of the first light-emitting unit 141: approximately 75 nm (30 nm to 200 nm)

Thickness of the intermediate layer 142: approximately 30 nm (1 nm to 100 nm)

Thickness of the second light-emitting unit 143: approximately 90 nm (30 nm to 200 nm)

Thickness of the upper electrode 122: approximately 85 nm (5 nm to 200 nm)

The shape of the overhang portion 150a of the partition is preferably a tapered shape so that disconnection of the upper electrode 122 can be prevented. The thickness of the partition 150 is preferably 10 μm or less because, when the partition 150 is too thick, the resistance of the upper electrode 122 is high.

The shape of the spacer 155 is not limited to the shape illustrated in FIG. 2B and may be a shape illustrated in FIG. 2C. A plan view in that case is illustrated in FIG. 2A2. The spacer 155 illustrated in FIG. 2C is formed between the lower electrodes 118a and 118b and over the end portion of each of the lower electrodes 118a and 118b, and the partition 150 is formed over the spacer 155. The partition 150 has the overhang portion 150a over the end portion of each of the lower electrodes 118a and 118b, and the spacer 155 is provided between the end portion of each of the lower electrodes 118a and 118b and the overhang portion 150a of the partition 150. The function of the spacer 155 is similar to that of the spacer 155 illustrated in FIG. 2B, and the overhang portion 150a of the partition 150 is preferably shaped so as to extend beyond the spacer 155. The spacer 155 illustrated in FIG. 2C is formed using an insulating material and electrically isolates the lower electrodes 118a and 118b of adjacent light-emitting portions from each other.

As illustrated in FIG. 3B, the relationship between the height L1 of the spacer 155 (i.e., the distance between the lower electrode 118b and the overhang portion 150a of the partition 150), the total thickness A1 of the first light-emitting unit 141 and the intermediate layer 142, and the total thickness A2 of the organic layer 120 and the upper electrode 122 is similar to that illustrated in FIG. 3A and has a similar effect. The thickness of the first light-emitting unit 141, the thickness of the intermediate layer 142, the thickness of the second light-emitting unit 143, and the thickness of the upper electrode 122 illustrated in FIG. 3B can be similar to those in FIG. 3A.

The layout of the spacer 155 is not limited to those illustrated in FIGS. 2A1 and 2A2, and may be the one illustrated in FIG. 2D or 2E. In FIGS. 2D and 2E, the spacer 155 has the shape illustrated in FIG. 2C but may have the shape illustrated in FIG. 2B. In FIGS. 2A1 and 2D, the spacer 155 is provided between adjacent light-emitting portions which exhibit different colors, and is not provided between adjacent light-emitting portions which exhibit the same color. In FIG. 2E, the spacer 155 is provided between all adjacent light-emitting portions. It is acceptable as long as the spacer 155 is provided at least between adjacent light-emitting portions which exhibit different colors. Accordingly, the first light-emitting unit 141 and the intermediate layer 142 can be disconnected at the overhang portion 150a of the partition 150 between adjacent light-emitting portions which exhibit different colors.

The layout of the spacer 155 illustrated in FIG. 2E is advantageous in that the lower electrodes 118a and 118b and the spacer 155 can be formed using the same mask and there is no increase in the number of masks needed to manufacture a light-emitting device.

Figure 5A:
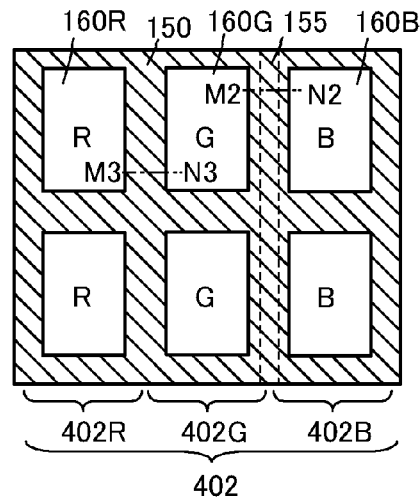
FIGS. 5A, 5B, 5E, and 5F are top views of pixels.
Figure 5B:
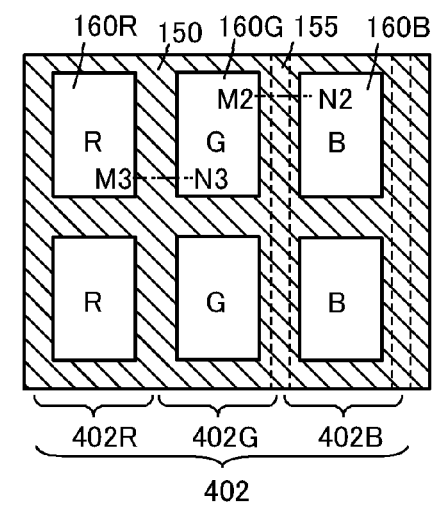
Figure 5C:
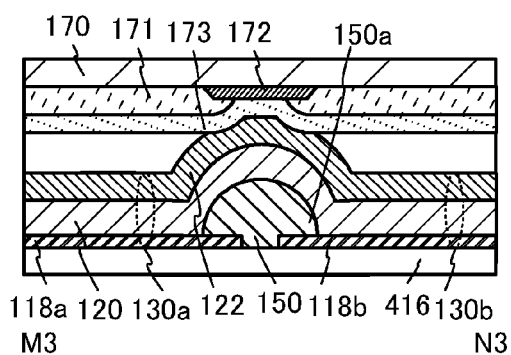
FIG. 5C is a cross-sectional view along dashed line M3-N3 in FIGS. 5A and 5B.

The spacer 155 is not necessarily provided between all adjacent light-emitting potions which exhibit different colors, and may be provided only between some adjacent light-emitting portions which exhibit different colors. FIG. 5A illustrates an example in which the spacer 155 is provided only between the sub-pixel 402B which emits blue light and the sub-pixel 402G which emits green light (see the cross-sectional view in FIG. 2B). FIG. 5B illustrates an example in which the spacer 155 is further provided between the sub-pixel 402B which emits blue light and the sub-pixel 402R which emits red light (in other words, the spacer 155 is not provided between the sub-pixel 402R which emits red light and the sub-pixel 402G which emits green light). Note that a cross-sectional view of a portion between the sub-pixel 402R which emits red light and the sub-pixel 402G which emits green light in FIGS. 5A and 5B, where the spacer 155 is not provided, is illustrated in FIG. 5C.

Figure 5D:
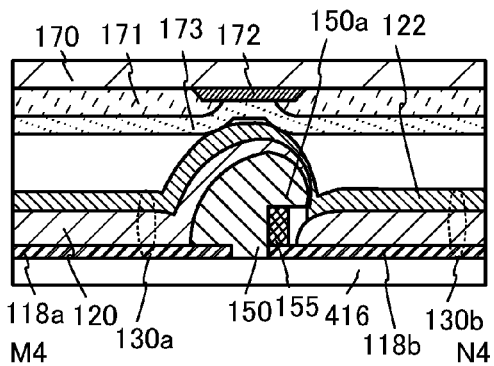
FIG. 5D is a cross-sectional view along dashed line M4-N4 in FIGS. 5E and 5F.
Figure 5E:
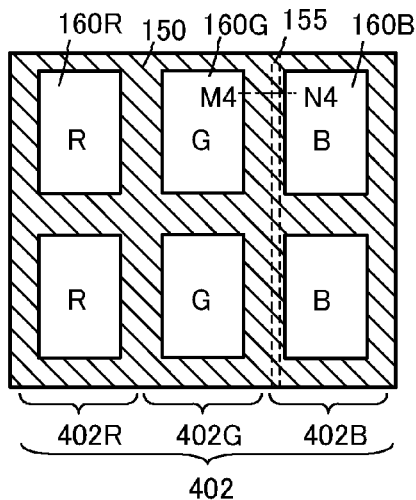
Figure 5F:
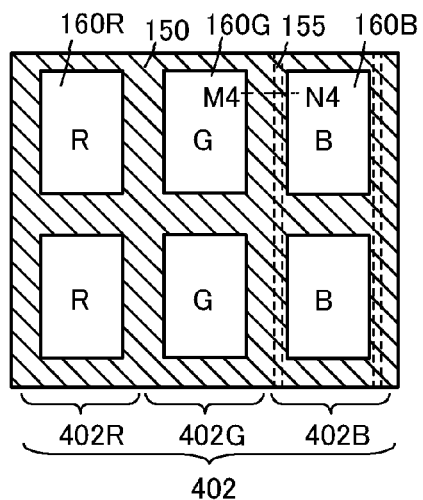

As illustrated in FIGS. 5E and 5F, the spacer 155 may be provided only over the end portion of one of the lower electrodes (here, the lower electrode 118b) between adjacent light-emitting portions which exhibit different colors (see the cross-sectional view in FIG. 5D).

Figure 6A:
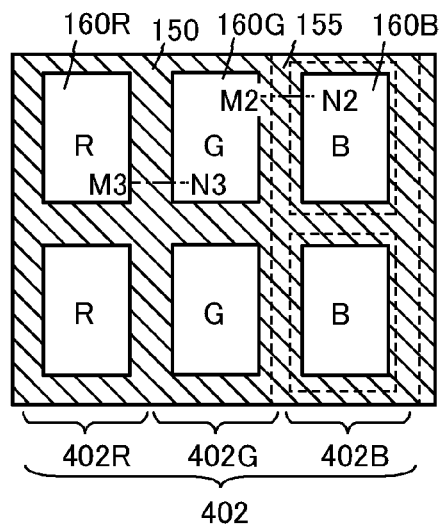
FIGS. 6A to 6D are top views of pixels.
Figure 6B:
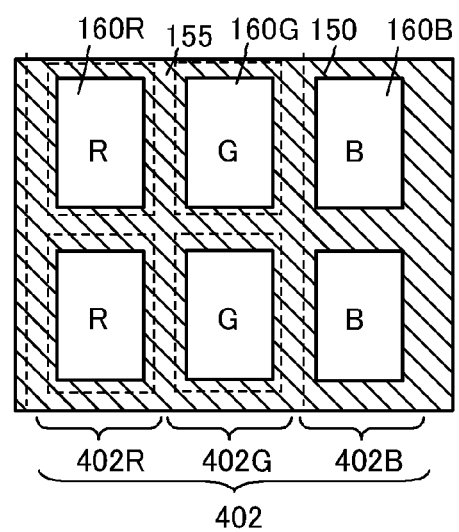
Figure 6C:
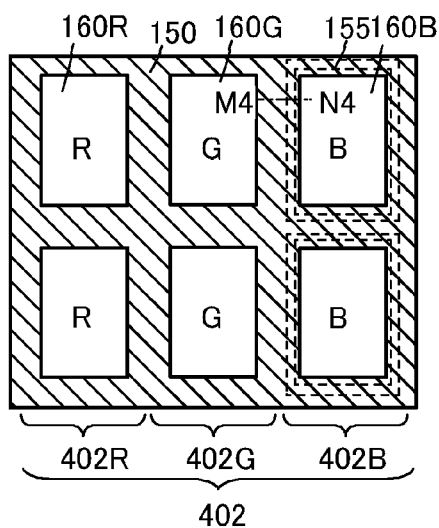
Figure 6D:
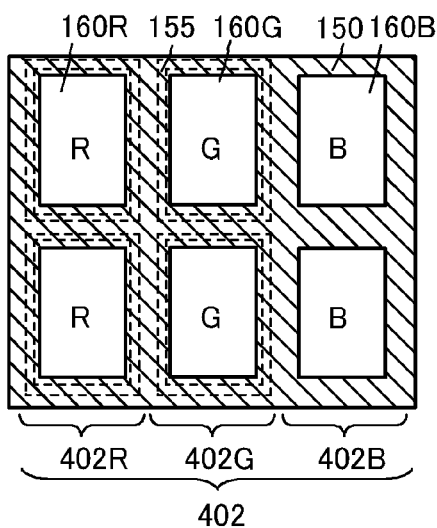

The spacer 155 may be provided between adjacent light-emitting portions which exhibit the same color. FIGS. 6A and 6C each illustrate an example in which the spacer 155 is provided between adjacent sub-pixels 402B which emit blue light, and FIGS. 6B and 6D each illustrate an example in which the spacer 155 is provided between adjacent sub-pixels 402G which emit green light and between adjacent sub-pixels 402R which emit red light. Furthermore, the spacer 155 may be provided between all adjacent light-emitting portions which exhibit the same color.

When the upper electrode 122 has a region with a small thickness due to the presence of the spacer 155, the region has high resistance. This causes an increase in resistance of the upper electrode 122 as a whole, which might cause a defect such as luminance unevenness. However, by selection of an appropriate layout of the spacer 155, suppression of crosstalk and suppression of an increase in resistance of the upper electrode can both be achieved.

For example, it is preferable to provide the spacer 155 only between light-emitting portions where crosstalk is most likely to occur. In the case where crosstalk is likely to occur from the blue light-emitting portion 160B to the red light-emitting portion 160R or the green light-emitting portion 160G, for example, the spacer 155 is provided between the blue light-emitting portion 160B and the red light-emitting portion 160R or between the blue light-emitting portion 160B and the green light-emitting portion 160G.

Note that FIGS. 2B and 2C and FIG. 5C each illustrate the case, as an example, where the organic layer 120 is disconnected and the upper electrode 122 is not disconnected between adjacent light-emitting portions. In FIGS. 2D and 2E, the illustration of the organic layer 120, the upper electrode 122, the overcoat layer 173, the color filter 171, the black matrix 172, and the counter substrate 170 is omitted, and an opening in the partition 150 corresponds to a light-emitting portion (the red light-emitting portion 160R, the green light-emitting portion 160G, or the blue light-emitting portion 160B).

In accordance with this embodiment, the first light-emitting unit 141 is disconnected at the overhang portion 150a of the partition 150, whereby a highly conductive layer (such as a carrier-injection layer) included in the first light-emitting unit 141 can also be disconnected. Accordingly, the electrical continuity of the highly conductive layer is lost and continuous current flow is suppressed. Thus, occurrence of a crosstalk phenomenon between adjacent pixels or sub-pixels which emit light of different colors can be suppressed.

In addition, the intermediate layer 142 is disconnected at the overhang portion 150a of the partition 150, whereby the electrical continuity of the intermediate layer 142 is lost and continuous current flow is suppressed. Thus, occurrence of a crosstalk phenomenon between adjacent pixels or sub-pixels which emit light of different colors can be suppressed.

Furthermore, since the upper electrode 122 is not disconnected, the potential of the upper electrode 122 is uniform in adjacent pixels, and the upper electrode 122 has a uniform potential in terms of a plane, and preferably the entire upper electrode 122 has a uniform potential. Thus, there is an effect of suppressing a voltage decrease or the like.

The partition 150 is preferably formed using a material which absorbs visible light, in which case it is possible to suppress viewing angle dependence or degradation of chromaticity due to extraction of light produced in a light-emitting element from an adjacent pixel by transmission through the partition 150, for example.

<Sealing Structure>

The display panel 400 shown as an example in this embodiment has a structure in which the light-emitting element is sealed in the space 431 enclosed by the first substrate 410, the second substrate 170, and the sealant 405 (see FIGS. 1A and 1B).

The space 431 can be filled with an inert gas (e.g., nitrogen or argon) or resin. An absorbent for impurities (typically, water and/or oxygen) such as a dry agent may be provided in the space 431.

The sealant 405 and the second substrate 170 are desirably formed using a material which does not transmit impurities in the air (typically, water and/or oxygen) as much as possible. An epoxy-based resin, glass frit, or the like can be used for the sealant 405.

Examples of the second substrate 170 include a glass substrate; a quartz substrate; a plastic substrate formed of polyvinyl fluoride (PVF), polyester, an acrylic resin, or the like; a substrate of fiberglass-reinforced plastics (FRP); and the like.

<Method for Manufacturing Partition>
[First Manufacturing Method: Forming a Sacrifice Layer Using a Different Photomask From a Lower Electrode]

FIGS. 7A to 7E are cross-sectional views illustrating a method for manufacturing a partition according to one embodiment of the present invention.

Figure 7A:
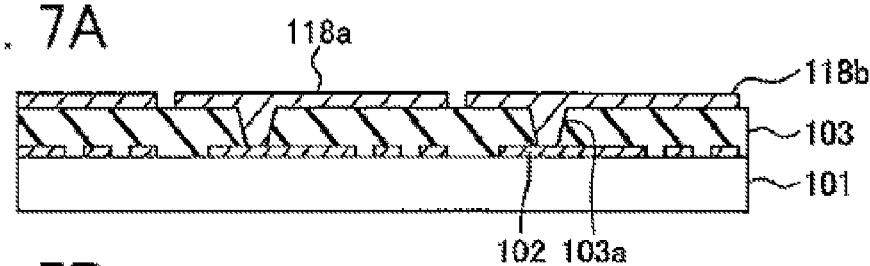
FIGS. 7A to 7E are cross-sectional views illustrating a method for manufacturing a partition according to one embodiment of the present invention.

First, as illustrated in FIG. 7A, an insulating film (not illustrated) is formed over a glass substrate 101, and wirings 102 and TFTs (not illustrated) are formed over the insulating film. Next, an insulating layer 103 is formed as a planarization film over the wirings 102 and the TFTs. Then, the insulating layer 103 is processed by etching, whereby contact holes 103a located over the wirings 102 are formed in the insulating layer 103. After that, an electrode layer is formed in the contact holes 103a and over the insulating layer 103, and the electrode layer is processed by etching, whereby lower electrodes 118a and 118b are formed in the contact holes 103a and over the insulating layer 103.

Figure 7B:
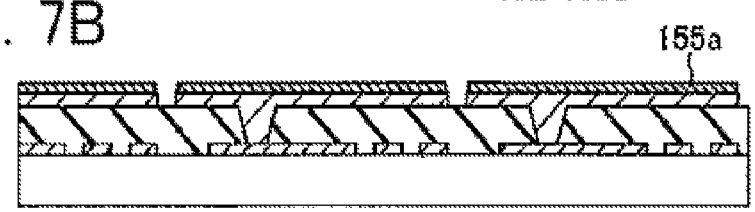

Next, as illustrated in FIG. 7B, a sacrifice layer is formed over the lower electrodes 118a and 118b and the insulating layer 103, and a photomask film (not illustrated) is formed over the sacrifice layer. The sacrifice layer formed in the first manufacturing method may be a conductor, an insulator, or a semiconductor. Then, the sacrifice layer is processed by etching using the photomask film as a mask, whereby the sacrifice layer is removed from a portion between the lower electrodes 118a and 118b and a sacrifice layer 155a is left over each of the lower electrodes 118a and 118b. The sacrifice layer 155a has substantially the same planar shape as the lower electrodes 118a and 118b. Next, the photomask film is stripped. Note that the photomask film is manufactured by a photolithography technique.

Note that in the case where the sacrifice layer is formed using a photosensitive resin, the sacrifice layer 155a (patterned sacrifice layer) illustrated in FIG. 7B can be formed by a photolithography technique. This is preferable because the photomask film does not need to be separately formed over the sacrifice layer and the number of steps can be reduced.

Figure 7C:
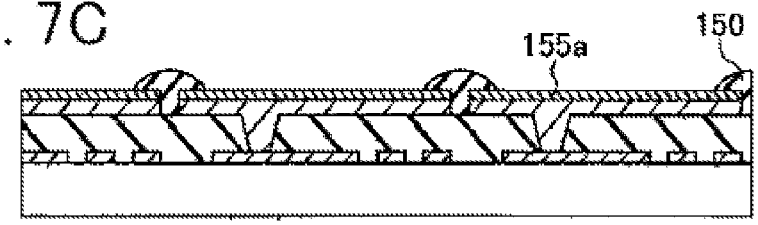

Next, as illustrated in FIG. 7C, a partition 150 is formed over the insulating layer 103 between the lower electrodes 118a and 118b and over the sacrifice layer 155a. The partition 150 covers an edge of each of the sacrifice layer 155a and the lower electrodes 118a and 118b and has an overhang shape so as to extend over the lower electrodes 118a and 118b. The lower electrodes 118a and 118b adjacent to each other are electrically isolated from each other by the partition 150.

Figure 7D:
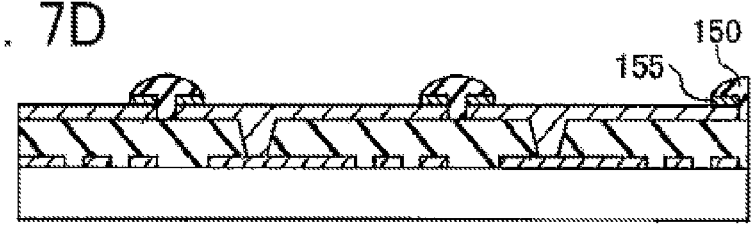

Next, as illustrated in FIG. 7D, the sacrifice layer 155a is removed by etching using the partition 150 as a mask. Accordingly, a spacer 155 is formed from the sacrifice layer 155a under the overhang shape portion of the partition 150. At this time, with the amount of etching controlled by etching time, the sacrifice layer 155a may be removed such that the overhang shape portion of the partition 150 extends beyond the spacer 155 (see FIG. 7E), or the entire sacrifice layer 155a may be removed.

When the spacer 155 is manufactured by etching using the partition 150 as a mask, self-alignment is possible, and this manufacturing method can be applied to a high definition panel.

Note that examples of combinations of materials that can be used for the lower electrodes 118a and 118b, a conductive sacrifice layer 155a, an etchant, and the partition 150 are given below.

Example 1

Lower electrode: silver, silver-magnesium alloy, indium tin oxide (ITO), or metal oxide in which indium is mixed with zinc oxide Conductive sacrifice layer: Al or Al alloy Etchant: photoresist developer (alkali metal such as tetramethyl ammonium hydroxide (TMAH))

Partition: acrylic-based resin, polyimide-based resin, siloxane-based resin, phenol-based resin, novolac-based resin, or the like Example 2

Lower electrode: ITO, Ti oxide, or the like

Conductive sacrifice layer: indium zinc oxide

Etchant: oxalic acid etchant

Partition: acrylic-based resin, polyimide-based resin, siloxane-based resin, phenol-based resin, novolac-based resin, or the like Example 3

Lower electrode: ITO, Ti oxide, or the like

Insulating sacrifice layer: polyimide-based resin, acrylic-based resin, phenol-based resin, or the like Etching: $O_2$ ashing Partition: siloxane-based resin, $SiO_2$, or the like After that, a first light-emitting unit 141 is formed over the lower electrode 118b and the partition 150 by an evaporation method, and an intermediate layer 142 is formed over the first light-emitting unit 141 by an evaporation method. Next, a second light-emitting unit 143 is formed over the intermediate layer 142 by an evaporation method, and an upper electrode 122 is formed over the second light-emitting unit 143. Here, the thickness of the spacer 155 over the lower electrode 118b is larger than the height from a surface of the lower electrode 118b to a surface of the intermediate layer 142, and is smaller than or equal to the height from the surface of the lower electrode 118b to a surface of the upper electrode 122 (see FIG. 3A).

Next, a color filter 171 is provided near or in contact with the upper electrode 122 over the partition 150, and a light-emitting element, together with an inert gas, a resin, or the like, is sealed with a sealant (not illustrated). The color filter 171 includes a blue color filter overlapping with the lower electrode 118b and a green color filter overlapping with the lower electrode 118a, and a black matrix 172 is formed between the blue color filter and the green color filter (see FIG. 2B).

In the first manufacturing method illustrated in FIGS. 7A to 7E, the sacrifice layer 155a is patterned by etching before the partition 150 is formed; thus, the spacer 155 can be formed from the sacrifice layer 155a in a given position. Accordingly, as illustrated in FIGS. 2A1 and 2D, for example, it is possible to provide the spacer 155 between adjacent light-emitting portions which exhibit different colors but not between adjacent light-emitting portions which exhibit the same color. Thus, a stripe structure in which the intermediate layer 142 is disconnected in the direction of different colors and the intermediate layer 142 is not disconnected in the direction of the same color can lower the probability of occurrence of defective lighting due to disconnection of the upper electrode 122.

In another example of forming the spacer 155 in a given position, the spacer 155 is not formed in only a corner portion of a light-emitting portion, or the like. The position of disconnection of the intermediate layer can be freely determined depending on how much emphasis is placed on crosstalk prevention.

[Second Manufacturing Method: Forming a Sacrifice Layer Using the Same Photomask as a Lower Electrode]

FIGS. 8A, 8B1, 8B2, and 8C to 8E are cross-sectional views illustrating a method for manufacturing a partition according to one embodiment of the present invention.

Steps up to and including the step in which the contact holes 103a located over the wirings 102 are formed in the insulating layer 103 as illustrated in FIG. 8A are similar to those in the manufacturing method illustrated in FIGS. 7A to 7E. Next, an electrode layer 118 is formed in the contact holes 103a and over the insulating layer 103, and a sacrifice layer 155a is formed over the electrode layer 118. The sacrifice layer 155a formed in the second manufacturing method may be a conductor, an insulator, or a semiconductor.

Next, as illustrated in FIG. 8B1, a photomask film 145 is formed over the sacrifice layer 155a, and the sacrifice layer 155a and the electrode layer 118 are processed by etching using the photomask film 145 as a mask. Accordingly, as illustrated in FIG. 8C, lower electrodes (reflective electrodes) 118a and 118b are formed in the contact holes 103a and over the insulating layer 103, and the sacrifice layer 155a is left over each of the lower electrodes 118a and 118b. Next, the photomask film is stripped.

Note that in the case where the sacrifice layer is formed using a photosensitive resin, the sacrifice layer 155a (patterned sacrifice layer) illustrated in FIG. 8B2 can be formed by a photolithography technique, and the electrode layer 118 can be processed by etching using the sacrifice layer 155a as a mask. This is preferable because the photomask film does not need to be separately formed over the sacrifice layer and the number of steps can be reduced.

Next, as illustrated in FIG. 8D, a partition 150 is formed over the insulating layer 103 between the lower electrodes 118a and 118b and over the sacrifice layer 155a. The partition 150 covers an edge of each of the sacrifice layer 155a and the lower electrodes 118a and 118b and has an overhang shape so as to extend over the lower electrodes 118a and 118b. The lower electrodes 118a and 118b adjacent to each other are electrically isolated from each other by the partition 150.

Next, as illustrated in FIG. 8E, the sacrifice layer 155a is removed by etching using the partition 150 as a mask. Accordingly, a spacer 155 is formed from the sacrifice layer 155a under the overhang shape portion of the partition 150. At this time, with the amount of etching controlled by etching time, the sacrifice layer 155a may be removed such that the overhang shape portion of the partition 150 extends beyond the spacer 155, or the entire sacrifice layer 155a may be removed.

Note that in the second manufacturing method, a combination of materials that can be used for the lower electrodes 118a and 118b, the sacrifice layer 155a, the etchant, and the partition 150 can be similar to that in Example 1 or 2 in the first manufacturing method illustrated in FIGS. 7A to 7E.

Examples of other combinations of materials are given below.

Example 4

Lower electrode: ITO or indium zinc oxide

Insulating sacrifice layer: resin relatively susceptible to oxygen plasma, such as photoresist or acrylic-based resin Partition: resin relatively resistant to oxygen plasma, such as polyimide-based resin or siloxane-based resin Etching: dry etching with oxygen plasma In the case where photosensitive resins are used for the partition and the sacrifice layer as in Example 4, it is preferable that the partition and the sacrifice layer be collectively exposed to light, the partition and the sacrifice layer be developed, and the sacrifice layer be removed more than the partition with oxygen plasma using the partition as a mask.

Example 5

Lower electrode: ITO or indium zinc oxide
Insulating sacrifice layer: $SiN_x$, $SiO_2$, or the like
Etching: dry etching with fluorine plasma
Partition: acrylic-based resin, polyimide-based resin, siloxane-based resin, phenol-based resin, novolac-based resin, or the like Even when an inorganic material ($SiN_x$ by CVD) or the like is used for the sacrifice layer as in Example 5, the sacrifice layer can be selectively removed with respect to the partition by selecting gas species, e.g., by decreasing the proportion of oxygen and increasing the proportion of a fluorine-based gas in an etching gas.

Figure 7E:
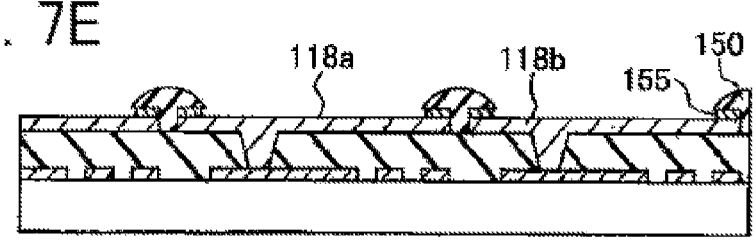

The following steps are similar to the steps after the above step in FIG. 7E and therefore not described here.

In the second manufacturing method illustrated in FIGS. 8A, 8B1, 8B2, and 8C to 8E, the sacrifice layer is formed using the same photomask as the lower electrode; thus, the top view of the pixel corresponds to that in FIG. 2E. Accordingly, crosstalk can be suppressed not only between adjacent light-emitting portions which exhibit different colors but also between adjacent light-emitting portions which exhibit the same color. In addition, the number of photomasks needed for the manufacture can be reduced.

[Third Manufacturing Method: Forming an Insulating Sacrifice Layer Using a Different Photomask from a Lower Electrode]

FIGS. 9A to 9E are cross-sectional views illustrating a method for manufacturing a partition according to one embodiment of the present invention.

Figure 9A:
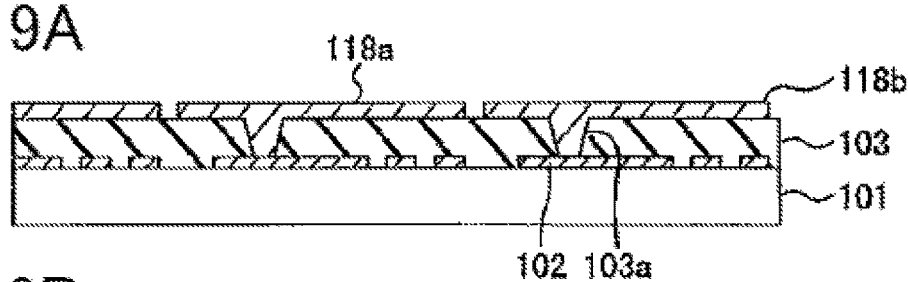
FIGS. 9A to 9E are cross-sectional views illustrating a method for manufacturing a partition according to one embodiment of the present invention.

The step in FIG. 9A is similar to the step in FIG. 7A and therefore not described here.

Figure 9B:
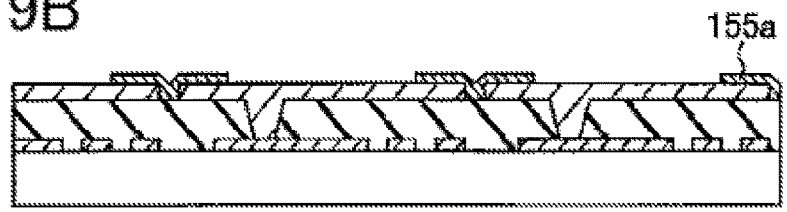

Next, as illustrated in FIG. 9B, an insulating sacrifice layer is formed over the lower electrodes 118a and 118b and the insulating layer 103, and a photomask film (not illustrated) is formed over the sacrifice layer. Then, the sacrifice layer is processed by dry etching using the photomask film as a mask, whereby the sacrifice layer is removed from a portion over a middle portion of an upper surface of each of the lower electrodes 118a and 118b and a sacrifice layer 155a is left between the lower electrodes 118a and 118b and over an end portion of each of the lower electrodes 118a and 118b. Next, the photomask film is stripped. Although the sacrifice layer 155a is left so as to extend between the adjacent lower electrodes 118a and 118b in FIG. 9B, a sacrifice layer may be left so as to be disconnected between the adjacent lower electrodes 118a and 118b.

Figure 9C:
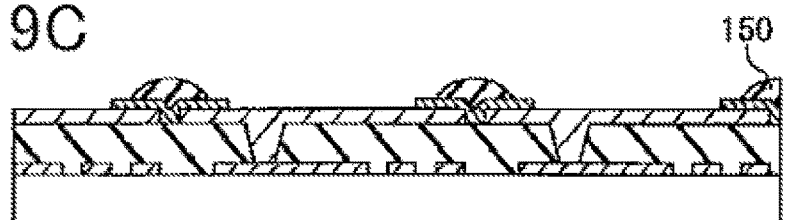

Next, as illustrated in FIG. 9C, a partition 150 is formed over the sacrifice layer 155a. The partition 150 has an overhang shape so as to extend over the lower electrodes 118a and 118b. The lower electrodes 118a and 118b adjacent to each other are electrically isolated from each other by the sacrifice layer 155a.

Figure 9D:
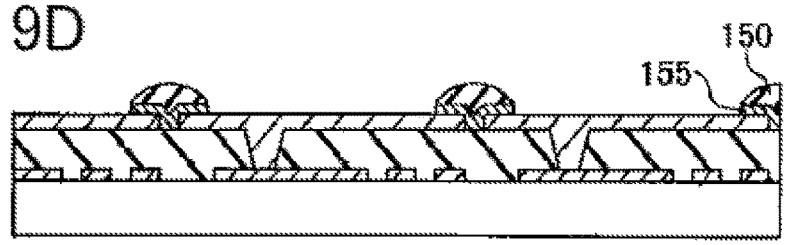
Figure 9E:
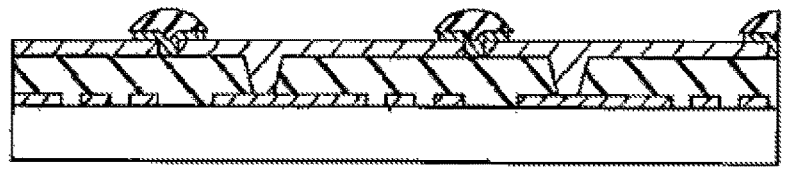

Next, as illustrated in FIG. 9D, the sacrifice layer 155a is removed by dry etching using the partition 150 as a mask. Accordingly, a spacer 155 is formed from the sacrifice layer 155a under the overhang shape portion of the partition 150. At this time, with the amount of etching controlled by etching time, the sacrifice layer 155a may be removed such that the overhang shape portion of the partition 150 extends beyond the spacer 155 (see FIG. 9E).

Note that a combination of materials that can be used for the lower electrodes 118a and 118b, the insulating sacrifice layer 155a, the etching, and the partition 150 can be similar to that in Example 3 in the first manufacturing method illustrated in FIGS. 7A to 7E or that in Example 4 or 5 in the second manufacturing method illustrated in FIGS. 8A, 8B1, 8B2, and 8C to 8E.

The following steps are similar to the steps after the above step in FIG. 7E and therefore not described here.

In the third manufacturing method illustrated in FIGS. 9A to 9E, the sacrifice layer 155a is patterned by etching before the partition 150 is formed; thus, the spacer 155 can be formed from the sacrifice layer 155a in a given position. Accordingly, an effect similar to that of the first manufacturing method illustrated in FIGS. 7A to 7E can be obtained.

[Fourth Manufacturing Method: Forming an Insulating Sacrifice Layer Using a Different Photomask from a Lower Electrode]

Figure 10A:
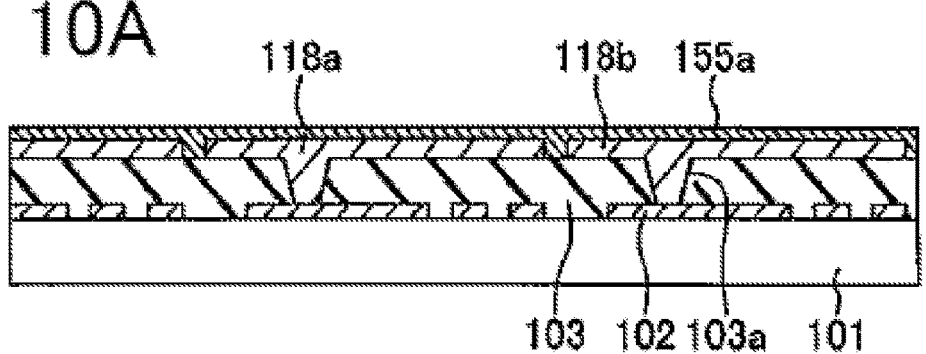
FIGS. 10A to 10C are cross-sectional views illustrating a method for manufacturing a partition according to one embodiment of the present invention.
Figure 10B:
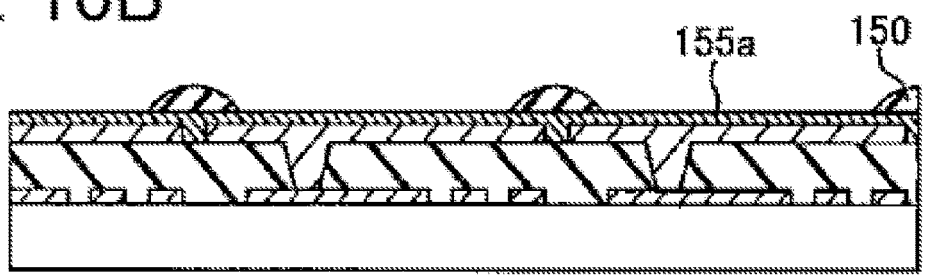
Figure 10C:
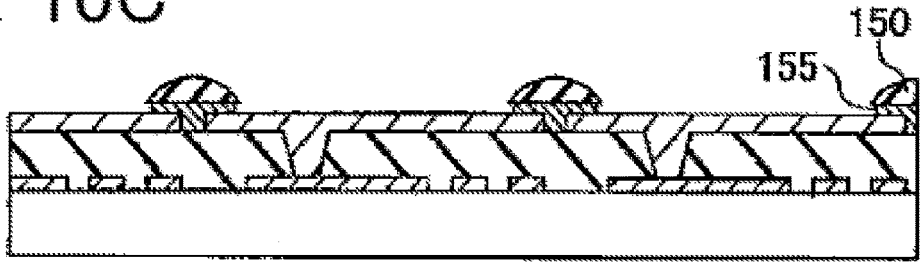

FIGS. 10A to 10C are cross-sectional views illustrating a method for manufacturing a partition according to one embodiment of the present invention.

After a step similar to that in FIG. 7A is performed, an insulating sacrifice layer 155a is formed over the lower electrodes 118a and 118b and the insulating layer 103 (see FIG. 10A).

Next, as illustrated in FIG. 10B, the partition 150 is formed over the sacrifice layer 155a. The partition 150 has an overhang shape so as to extend over the lower electrodes 118a and 118b. The lower electrodes 118a and 118b adjacent to each other are electrically isolated from each other by the sacrifice layer 155a.

Next, as illustrated in FIG. 10C, the sacrifice layer 155a is removed by dry etching using the partition 150 as a mask. Accordingly, a spacer 155 is formed from the sacrifice layer 155a under the overhang shape portion of the partition 150. At this time, with the amount of etching controlled by etching time, the sacrifice layer 155a may be removed such that the overhang shape portion of the partition 150 extends beyond the spacer 155.

Note that a combination of materials that can be used for the lower electrodes 118a and 118b, the insulating sacrifice layer 155a, the etching, and the partition 150 can be similar to that in the third manufacturing method illustrated in FIGS. 9A to 9E.

The following steps are similar to the steps after the above step in FIG. 7E and therefore not described here.

Embodiment 2

A configuration example of a light-emitting element which can be used in a light-emitting module according to one embodiment of the present invention will be described with reference to FIGS. 11A to 11C.

The light-emitting element shown as an example in this embodiment includes a lower electrode, an upper electrode, and an organic layer between the lower electrode and the upper electrode. One of the lower and upper electrodes functions as an anode, and the other functions as a cathode. The organic layer is provided between the lower electrode and the upper electrode, and a structure of the organic layer may be appropriately determined in accordance with materials of the lower electrode and the upper electrode.

<Configuration Example of Light-Emitting Element>

Figure 11A:
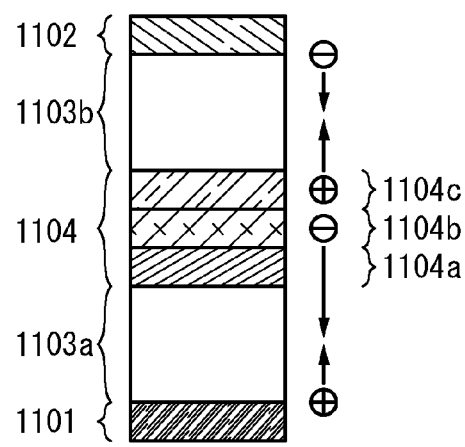
FIG. 11A illustrates a structure of a tandem light-emitting element in which two light-emitting units are stacked.

An example of a configuration of the light-emitting element is illustrated in FIG. 11A. In the light-emitting element illustrated in FIG. 11A, an organic layer including a light-emitting unit 1103a and a light-emitting unit 1103b is provided between an anode 1101 and a cathode 1102. Furthermore, an intermediate layer 1104 is provided between the light-emitting unit 1103a and the light-emitting unit 1103b.

When a voltage higher than the threshold voltage of the light-emitting element is applied between the anode 1101 and the cathode 1102, holes are injected to the organic layer from the anode 1101 side and electrons are injected to the organic layer from the cathode 1102 side. The injected electrons and holes are recombined in the organic layer, so that a light-emitting substance contained in the organic layer emits light.

The number of light-emitting units provided between the anode 1101 and the cathode 1102 is not limited to two. A light-emitting element illustrated in FIG. 11C has what is called a tandem structure, that is, a structure in which a plurality of light-emitting units 1103 is stacked. Note that in the case where n (n is a natural number greater than or equal to 2) light-emitting units 1103 are provided between the anode and the cathode, for example, the intermediate layer 1104 is provided between an m-th light-emitting unit and an (m+1)-th light-emitting unit.

The light-emitting unit 1103 includes at least one light-emitting layer containing a light-emitting substance, and may have a structure in which the light-emitting layer and a layer other than the light-emitting layer are stacked. Examples of the layer other than the light-emitting layer are layers which contain a substance having a high hole-injection property, a substance having a high hole-transport property, a substance having a poor hole-transport property (substance which blocks holes), a substance having a high electron-transport property, a substance having a high electron-injection property, a substance having a bipolar property (substance having high electron- and hole-transport properties), and the like. In particular, the layer which contains a substance having a high hole-injection property and is provided in contact with the anode and the layer which contains a substance having a high electron-injection property and is provided in contact with the cathode serve to lower a barrier against carrier injection from the electrodes to the light-emitting unit. These layers can be each referred to as a carrier-injection layer.

Figure 11B:
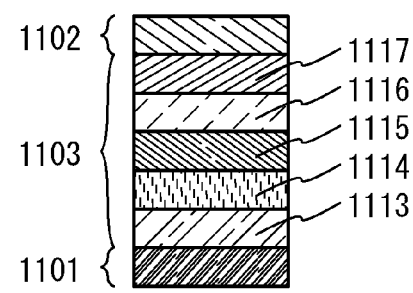
FIG. 11B illustrates an example of a specific structure of a light-emitting unit.
Figure 11C:
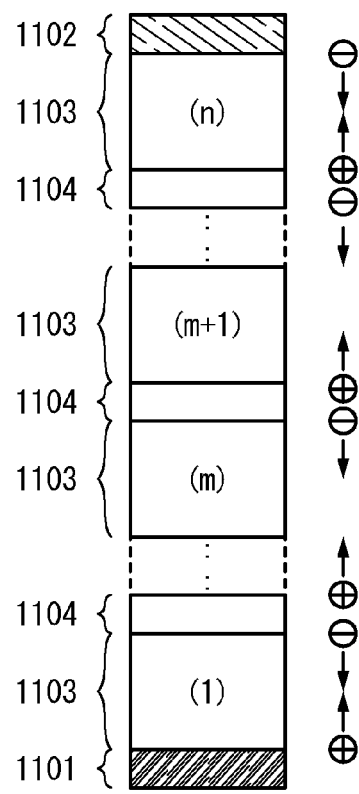
FIG. 11C illustrates a structure of a tandem light-emitting element in which a plurality of light-emitting units is stacked.
Figure 12:
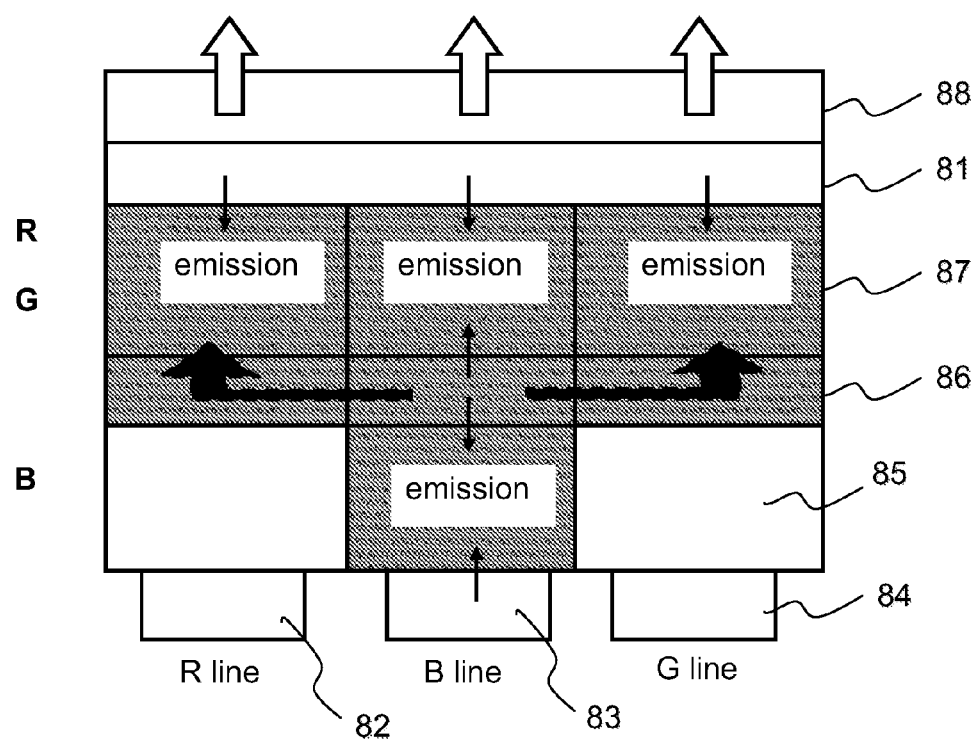
FIG. 12 is a schematic diagram illustrating occurrence of a crosstalk phenomenon due to a highly conductive intermediate layer.
Figure 13:
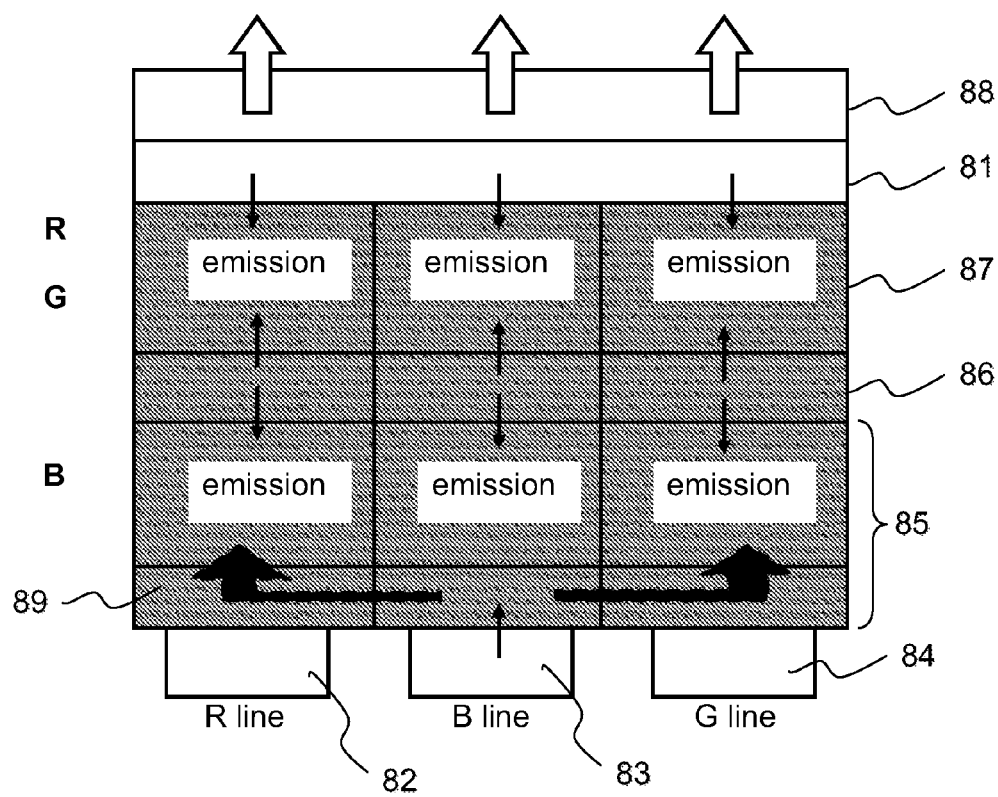
FIG. 13 is a schematic diagram illustrating occurrence of a crosstalk phenomenon due to a highly conductive carrier-injection layer.

An example of a specific configuration of the light-emitting unit 1103 is illustrated in FIG. 11B. In the light-emitting unit 1103 illustrated in FIG. 11B, a hole-injection layer 1113, a hole-transport layer 1114, a light-emitting layer 1115, an electron-transport layer 1116, and an electron-injection layer 1117 are stacked in this order from the anode 1101 side.

An example of a specific structure of the intermediate layer 1104 is illustrated in FIG. 11A. The intermediate layer 1104 may be formed to include at least a charge-generation region, and may have a structure in which the charge-generation region and a layer other than the charge-generation region are stacked. For example, a structure can be employed in which a first charge-generation region 1104c, an electron-relay layer 1104b, and an electron-injection buffer layer 1104a are stacked in this order from the cathode 1102 side.

The behaviors of electrons and holes in the intermediate layer 1104 are described. When a voltage higher than the threshold voltage of the light-emitting element is applied between the anode 1101 and the cathode 1102, in the first charge-generation region 1104c, holes and electrons are generated, and the holes move into the light-emitting unit 1103b provided on the cathode 1102 side and the electrons move into the electron-relay layer 1104b.

The electron-relay layer 1104b has a high electron-transport property and immediately transfers the electrons generated in the first charge-generation region 1104c to the electron-injection buffer layer 1104a. The electron-injection buffer layer 1104a can lower a barrier against electron injection into the light-emitting unit 1103a, so that the efficiency of the electron injection into the light-emitting unit 1103a is increased. Thus, the electrons generated in the first charge-generation region 1104c are injected into the lowest unoccupied molecular orbital (hereinafter referred to as "LUMO level") of the light-emitting unit 1103a through the electron-relay layer 1104b and the electron-injection buffer layer 1104a.

In addition, the electron-relay layer 1104b can prevent interaction in which the substance included in the first charge-generation region 1104c and the substance included in the electron-injection buffer layer 1104a react with each other at the interface therebetween and the functions of the first charge-generation region 1104c and the electron-injection buffer layer 1104a are impaired.

The holes injected into the light-emitting unit 1103b provided on the cathode side are recombined with electrons injected from the cathode 1102, so that a light-emitting substance contained in the light-emitting unit 1103b emits light. The electrons injected into the light-emitting unit 1103a provided on the anode side are recombined with holes injected from the anode side, so that a light-emitting substance contained in the light-emitting unit 1103a emits light. Thus, the holes and electrons generated in the intermediate layer 1104 cause light emission in different light-emitting units.

Note that the light-emitting units can be provided in contact with each other when these light-emitting units allow the same structure as the intermediate layer to be formed therebetween. Specifically, when one surface of the light-emitting unit is provided with a charge-generation region, the charge-generation region functions as a first charge-generation region of the intermediate layer; thus, the light-emitting units can be provided in contact with each other.

Note that an intermediate layer may be provided between the cathode and the n-th light-emitting unit.

<Material for Light-Emitting Element>

Next, specific materials that can be used for the light-emitting element having the above-described structure are described. Materials for the anode, the cathode, the organic layer, the charge-generation region, the electron-relay layer, and the electron-injection buffer layer are described in this order.

<Material for Anode>

The anode 1101 is preferably formed using a metal, an alloy, an electrically conductive compound, a mixture of these materials, or the like which has a high work function (specifically, a work function of higher than or equal to 4.0 eV is more preferable). Specifically, for example, indium tin oxide (ITO), indium tin oxide containing silicon or silicon oxide, indium zinc oxide (IZO), indium oxide containing tungsten oxide and zinc oxide, and the like are given.

Besides, the following can be given: gold (Au), platinum (Pt), nickel (Ni), tungsten (W), chromium (Cr), molybdenum (Mo), iron (Fe), cobalt (Co), copper (Cu), palladium (Pd), titanium (Ti), nitride of a metal material (e.g., titanium nitride), molybdenum oxide, vanadium oxide, ruthenium oxide, tungsten oxide, manganese oxide, titanium oxide, and the like.

Note that in the case where a second charge-generation region is provided in contact with the anode 1101, a variety of conductive materials can be used for the anode 1101 regardless of their work functions. Specifically, besides a material which has a high work function, a material which has a low work function can also be used for the anode 1101. A material for forming the second charge-generation region will be subsequently described together with a material for forming the first charge-generation region.

<Material for Cathode>

As a material of the cathode 1102, a material having a low work function (specifically, a work function of lower than 4.0 eV) is preferably used; however, in the case where the first charge-generation region is provided between the cathode 1102 and the light-emitting unit 1103 to be in contact with the cathode 1102, various conductive materials can be used for the cathode 1102 regardless of their work functions.

Note that at least one of the cathode 1102 and the anode 1101 is formed using a conductive film that transmits visible light. For the conductive film that transmits visible light, for example, a film of indium oxide containing tungsten oxide, indium zinc oxide containing tungsten oxide, indium oxide containing titanium oxide, indium tin oxide containing titanium oxide, indium tin oxide, indium zinc oxide, and indium tin oxide to which silicon oxide is added can be given. Further, a metal thin film having a thickness small enough to transmit light (preferably, approximately 5 nm to 30 nm) can also be used.

<Material for Organic Layer>

Specific examples of materials for the layers included in the light-emitting unit 1103 will be given below.

<Hole-Injection Layer>

The hole-injection layer contains a substance having a high hole-injection property. As the substance having a high hole-injection property, for example, molybdenum oxide, vanadium oxide, ruthenium oxide, tungsten oxide, manganese oxide, or the like can be used. In addition, it is possible to use a phthalocyanine-based compound such as phthalocyanine (abbreviation: H$_2$Pc) or copper phthalocyanine (abbreviation: CuPc), a polymer such as poly(3,4-ethylenedioxythiophene)/poly(styrenesulfonate) (PEDOT/PSS), or the like to form the hole-injection layer.

Note that the second charge-generation region may be used instead of the hole-injection layer. When the second charge-generation region is used, a variety of conductive materials can be used for the anode 1101 regardless of their work functions as described above. A material for forming the second charge-generation region will be subsequently described together with a material for forming the first charge-generation region.

<Hole-Transport Layer>

The hole-transport layer contains a substance having a high hole-transport property. The hole-transport layer is not limited to a single layer, and may be a stack of two or more layers each containing a substance having a high hole-transport property. The hole-transport layer contains any substance having a higher hole-transport property than an electron-transport property, and preferably contains a substance having a hole mobility of $10^{-6}$ cm$^2$/Vs or higher because the driving voltage of the light-emitting element can be reduced.

<Light-Emitting Layer>

The light-emitting layer contains a light-emitting substance. The light-emitting layer is not limited to a single layer, and may be a stack of two or more layers each containing a light-emitting substance. As the light-emitting substance, a fluorescent compound or a phosphorescent compound can be used. A phosphorescent compound is preferably used as the light-emitting substance because the emission efficiency of the light-emitting element can be increased.

The light-emitting substance is preferably dispersed in a host material. A host material preferably has higher excitation energy than the light-emitting substance.

<Electron-Transport Layer>

The electron-transport layer contains a substance having a high electron-transport property. The electron-transport layer is not limited to a single layer, and may be a stack of two or more layers each containing a substance having a high electron-transport property. The electron-transport layer contains any substance having a higher electron-transport property than a hole-transport property, and preferably contains a substance having an electron mobility of $10^{-6}$ cm$^2$/Vs or higher because the driving voltage of the light-emitting element can be reduced.

<Electron-Injection Layer>

The electron-injection layer contains a substance having a high electron-injection property. The electron-injection layer is not limited to a single layer, and may be a stack of two or more layers each containing a substance having a high electron-injection property. The electron-injection layer is preferably provided because the efficiency of electron injection from the cathode 1102 can be increased and the driving voltage of the light-emitting element can be reduced.

As the substance having a high electron-injection property, the following can be given: an alkali metal and an alkaline earth metal such as lithium (Li), cesium (Cs), calcium (Ca) and a compound thereof, such as lithium fluoride (LiF), cesium fluoride (CsF), and calcium fluoride (CaF$_2$). Alternatively, a layer containing a substance having an electron-transport property and an alkali metal, an alkaline earth metal, magnesium (Mg), or a compound thereof (e.g., an Alq layer containing magnesium (Mg)) can be used.

<Material for Charge-Generation Region>

The first charge-generation region 1104c and the second charge-generation region are regions containing a substance having a high hole-transport property and an acceptor substance. Note that the charge-generation region is not limited to the structure in which one film contains the substance having a high hole-transport property and the acceptor substance, and may be a stacked layer of a layer containing the substance having a high hole-transport property and a layer containing the acceptor substance. Note that in the case where the first charge-generation region which is in contact with the cathode has a stacked-layer structure, the layer containing the substance having a high hole-transport property is in contact with the cathode 1102. In the case where the second charge-generation region which is in contact with the anode has a stacked-layer structure, the layer containing the acceptor substance is in contact with the anode 1101.

Note that the acceptor substance is preferably added to the charge-generation region so that the mass ratio of the acceptor substance to the substance having a high hole-transport property is from 0.1:1 to 4.0:1.

As the acceptor substance that is used for the charge-generation region, a transition metal oxide, particularly an oxide of a metal belonging to any of Groups 4 to 8 of the periodic table is preferable. Specifically, molybdenum oxide is particularly preferable. Note that molybdenum oxide has a low hygroscopic property.

As the substance having a high hole-transport property used for the charge-generation region, any of a variety of organic compounds such as an aromatic amine compound, a carbazole derivative, an aromatic hydrocarbon, and a high molecular compound (including an oligomer, a dendrimer, or a polymer) can be used. Specifically, a substance having a hole mobility of $10^{-6}$ cm$^2$/Vs or higher is preferably used. However, any substance other than the above-described materials may also be used as long as the substance has a higher hole-transport property than an electron-transport property.

<Material for Electron-Relay Layer>

The electron-relay layer 1104*b* can immediately receive electrons drawn out by the acceptor substance in the first charge-generation region 1104*c*. Therefore, the electron-relay layer 1104*b* contains a substance having a high electron-transport property, and the LUMO level thereof is positioned between the acceptor level of the acceptor substance in the first charge-generation region 1104*c* and the LUMO level of the light-emitting unit 1103. Specifically, the LUMO level of the electron-relay layer 1104*b* is preferably about from −5.0 eV to −3.0 eV.

As the substance used for the electron-relay layer 1104*b*, for example, a perylene derivative and a nitrogen-containing condensed aromatic compound can be given. Note that a nitrogen-containing condensed aromatic compound is preferably used for the electron-relay layer 1104*b* because of its stability. Among nitrogen-containing condensed aromatic compounds, a compound having an electron-withdrawing group such as a cyano group or fluorine is preferably used because such a compound further facilitates acceptance of electrons in the electron-relay layer 1104*b*.

<Material for Electron-Injection Buffer Layer>

The electron-injection buffer layer 1104*a* facilitates electron injection from the first charge-generation region 1104*c* into the light-emitting unit 1103*a*. By providing the electron-injection buffer layer 1104*a* between the first charge-generation region 1104*c* and the light-emitting unit 1103*a*, the injection barrier therebetween can be lowered.

A substance having a high electron-injection property can be used for the electron-injection buffer layer 1104*a*. For example, an alkali metal, an alkaline earth metal, a rare earth metal, or a compound thereof (e.g., an alkali metal compound (including an oxide such as lithium oxide, a halide, and a carbonate such as lithium carbonate or cesium carbonate), an alkaline earth metal compound (including an oxide, a halide, and a carbonate), or a rare earth metal compound (including an oxide, a halide, and a carbonate)) can be used.

Further, in the case where the electron-injection buffer layer 1104*a* contains a substance having a high electron-transport property and a donor substance, the donor substance is preferably added so that the mass ratio of the donor substance to the substance having a high electron-transport property is from 0.001:1 to 0.1:1. Note that as the donor substance, an organic compound such as tetrathianaphthacene (abbreviation: TTN), nickelocene, or decamethylnickelocene can be used as well as an alkali metal, an alkaline earth metal, a rare earth metal, a compound of the above metal (e.g., an alkali metal compound (including an oxide such as lithium oxide, a halide, and a carbonate such as lithium carbonate or cesium carbonate), an alkaline earth metal compound (including an oxide, a halide, and a carbonate), and a rare earth metal compound (including an oxide, a halide, and a carbonate)). Note that as the substance having a high electron-transport property, a material similar to the above material for the electron-transport layer which can be formed in part of the light-emitting unit 1103 can be used.

<Method for Manufacturing Light-Emitting Element>

A method for manufacturing the light-emitting element will be described. Over the lower electrode, the layers described above are combined as appropriate to form an organic layer. Any of a variety of methods (e.g., a dry process or a wet process) can be used to form the organic layer depending on the material for the organic layer. For example, a vacuum evaporation method, an inkjet method, a spin coating method, or the like may be selected. Note that a different formation method may be employed for each layer. The upper electrode is formed over the organic layer, so that the light-emitting element is manufactured.

The light-emitting element described in this embodiment can be manufactured by combination of the above-described materials. Light emission from the above-described light-emitting substance can be obtained with this light-emitting element, and the emission color can be selected by changing the type of the light-emitting substance.

Further, a plurality of light-emitting substances which emit light of different colors can be used, whereby, for example, white light emission can also be obtained by expanding the width of the emission spectrum. In order to obtain white light emission, for example, a configuration may be employed in which at least two layers containing light-emitting substances are provided so that light of complementary colors is emitted. Specific examples of complementary colors include "blue and yellow", "blue-green and red", and the like.

Further, in order to obtain white light emission with an excellent color rendering property, an emission spectrum preferably spreads through the entire visible light region. For example, a light-emitting element may include layers emitting light of blue, green, and red.

Note that this embodiment can be implemented in an appropriate combination with any of the other embodiments described in this specification.

This application is based on Japanese Patent Application serial no. 2012-230150 filed with Japan Patent Office on Oct. 17, 2012, the entire contents of which are hereby incorporated by reference.

What is claimed is:

1. A light-emitting device comprising:
   a first electrode and a second electrode over an insulating layer;
   a partition over a portion between the first electrode and the second electrode, the partition including an overhang portion over an end portion of each of the first electrode and the second electrode;
   a first light-emitting unit over a top surface of the first electrode, a curved top surface of the partition, and a top surface of the second electrode;
   a first intermediate layer over a top surface of the first light-emitting unit;
   a second light-emitting unit over a top surface of the first intermediate layer; and
   a third electrode over a top surface of the second light-emitting unit and the curved top surface of the partition,
   wherein a distance between a bottom surface of the overhang portion and each of the top surface of the first electrode and the top surface of the second electrode is larger than a total thickness of the first light-emitting unit and the first intermediate layer over the first electrode, wherein the bottom surface faces each of the top surface of the first electrode and the top surface of the second electrode, wherein the insulating layer, each of the first electrode and the partition, the first light-emitting unit, the first intermediate layer, the second light-emitting unit, and the third electrode are sequentially stacked, and wherein a shape of the overhang portion is a forward tapered shape.

2. The light-emitting device according to claim 1, wherein the distance between the bottom surface of the overhang portion and each of the top surface of the first electrode and the top surface of the second electrode is smaller than or equal to a total thickness of the first light-emitting unit, the first intermediate layer, the second light-emitting unit, and the third electrode over the first electrode.

3. The light-emitting device according to claim 1, further comprising a spacer between the overhang portion and the end portion of each of the first electrode and the second electrode.

4. The light-emitting device according to claim 1,
wherein the partition is formed between the first electrode and the second electrode so as to be in contact with the end portion of each of the first electrode and the second electrode, and
wherein the first electrode and the second electrode are electrically isolated from each other by the partition.

5. The light-emitting device according to claim 1, further comprising a spacer between the first electrode and the second electrode so as to be in contact with the end portion of each of the first electrode and the second electrode,
wherein the first electrode and the second electrode are electrically isolated from each other by the spacer.

6. The light-emitting device according to claim 1, wherein a space is formed between the overhang portion and each of the first electrode and the second electrode.

7. The light-emitting device according to claim 1, wherein the first light-emitting unit comprises a carrier-injection layer.

8. The light-emitting device according to claim 1, further comprising a color filter over the first electrode and the second electrode,
wherein the color filter has a first color and a second color so as to overlap with the first electrode and the second electrode, respectively.

9. A light-emitting device comprising:
a first electrode and a second electrode over an insulating layer;
a partition over a portion between the first electrode and the second electrode, the partition including an overhang portion over an end portion of each of the first electrode and the second electrode;
a first light-emitting unit over a top surface of the first electrode, a curved top surface of the partition, and a top surface of the second electrode;
a first intermediate layer over a top surface of the first light-emitting unit;
a second light-emitting unit over a top surface of the first intermediate layer; and
a third electrode over a top surface of the second light-emitting unit and the curved top surface of the partition, wherein the first intermediate layer is disconnected between a bottom surface of the overhang portion and the top surface of the first electrode, wherein the bottom surface faces each of the top surface of the first electrode and the top surface of the second electrode, wherein the insulating layer, each of the first electrode and the partition, the first light-emitting unit, the first intermediate layer, the second light-emitting unit, and the third electrode are sequentially stacked, and wherein a shape of the overhang portion is a forward tapered shape.

10. The light-emitting device according to claim 1, wherein the third electrode is continuously formed from the first electrode to the curved top surface of the partition.

11. The light-emitting device according to claim 10, further comprising a second intermediate layer,
wherein the first electrode and the first intermediate layer are included in a first pixel,
wherein the second electrode and the second intermediate layer are included in a second pixel,
wherein the third electrode is continuous between the first pixel and the second pixel via the partition, and
wherein the first intermediate layer in the first pixel is disconnected from the second intermediate layer in the second pixel by the partition.

12. The light-emitting device according to claim 9, wherein the third electrode is continuously formed from the first electrode to the curved top surface of the partition.

13. The light-emitting device according to claim 12, further comprising a second intermediate layer,
wherein the first electrode and the first intermediate layer are included in a first pixel,
wherein the second electrode and the second intermediate layer are included in a second pixel,
wherein the third electrode is continuous between the first pixel and the second pixel via the partition, and
wherein the first intermediate layer in the first pixel is disconnected from the second intermediate layer in the second pixel by the partition.

14. A light-emitting device comprising:
a pixel including a first sub-pixel and a second sub-pixel;
a first electrode and a second electrode over an insulating layer;
a partition over a portion between the first electrode and the second electrode, the partition including an overhang portion over an end portion of each of the first electrode and the second electrode;
a first light-emitting unit over a top surface of the first electrode, a curved top surface of the partition, and a top surface of the second electrode;
an intermediate layer over a top surface of the first light-emitting unit;
a second light-emitting unit over a top surface of the intermediate layer;
a third electrode over a top surface of the second light-emitting unit and the curved top surface of the partition; and
a first spacer between the overhang portion and the end portion of the first electrode,
wherein each of the first sub-pixel and the second sub-pixel includes a first light-emitting portion and a second light-emitting portion adjacent to the first light-emitting portion in a column direction,
wherein the first light-emitting portion of the first sub-pixel and the second light-emitting portion of the first sub-pixel emit light of the same color, wherein the first light-emitting portion of the first sub-pixel and the first light-emitting portion of the second sub-pixel are provided in a row, wherein the first light-emitting portion of the first sub-pixel and the first light-emitting portion of the second sub-pixel emit light of different colors, wherein the first electrode is included in the first light-emitting portion of the first sub-pixel, wherein the second electrode is included in the first light-emitting portion of the second sub-pixel, wherein the first light-emitting portion and the second light-emitting portion of each of the first sub-pixel and the second sub-pixel are provided in openings of the partition, wherein the first spacer is provided between the first light-emitting portion of the first sub-pixel and the first light-emitting portion of the second sub-pixel, wherein the first spacer is not provided between the first light-emitting portion of the first sub-pixel and the second light-emitting portion of the first sub-pixel, wherein the first light-emitting unit and the intermediate layer are disconnected at the partition between the first light-emitting portion of the first sub-pixel and the first light-emitting portion of the second sub-pixel, and wherein the first light-emitting unit and the intermediate layer are connected at the partition between the first light-emitting portion of the first sub-pixel and the second light-emitting portion of the first sub-pixel.

15. The light-emitting device according to claim 14, further comprising a second spacer between the overhang portion and the end portion of the second electrode, wherein the second spacer is provided between the first light-emitting portion of the first sub-pixel and the first light-emitting portion of the second sub-pixel, and wherein the second spacer is not provided between the first light-emitting portion of the first sub-pixel and the second light-emitting portion of the first sub-pixel.

* * * * *